(12) United States Patent
Foland

(10) Patent No.: US 11,772,514 B2
(45) Date of Patent: Oct. 3, 2023

(54) SYSTEMS AND METHODS FOR PREDICTING DEGRADATION OF A BATTERY FOR USE IN AN ELECTRIC VEHICLE

(71) Applicant: BETA AIR, LLC, South Burlington, VT (US)

(72) Inventor: Steven J. Foland, Garland, TX (US)

(73) Assignee: BETA AIR, LLC, South Burlington, VT (US)

( * ) Notice: Subject to any disclaimer, the term of this patent is extended or adjusted under 35 U.S.C. 154(b) by 0 days.

(21) Appl. No.: 18/090,336

(22) Filed: Dec. 28, 2022

(65) Prior Publication Data

US 2023/0173946 A1 Jun. 8, 2023

Related U.S. Application Data

(63) Continuation of application No. 17/524,265, filed on Nov. 11, 2021, now Pat. No. 11,577,625.

(51) Int. Cl.
| | |
|---|---|
| *B60L 58/16* | (2019.01) |
| *B60L 58/12* | (2019.01) |
| *G06N 5/022* | (2023.01) |
| *B64D 27/24* | (2006.01) |

(52) U.S. Cl.
CPC .............. *B60L 58/16* (2019.02); *B60L 58/12* (2019.02); *B64D 27/24* (2013.01); *G06N 5/022* (2013.01); *B60L 2200/10* (2013.01)

(58) Field of Classification Search
CPC ...... B60L 58/16; B60L 58/12; B60L 2200/10; B64D 27/24; G06N 5/022
USPC ......................................................... 701/31.9
See application file for complete search history.

(56) References Cited

U.S. PATENT DOCUMENTS

| | | | |
|---|---|---|---|
| 9,217,779 B2 * | 12/2015 | Xu ..................... | G01R 31/3842 |
| 2017/0331323 A1 * | 11/2017 | Ehrmantraut ............ | H02J 7/35 |
| 2021/0234745 A1 * | 7/2021 | Mendes ................ | H04W 72/27 |
| 2022/0149645 A1 * | 5/2022 | Ramanujam .............. | B60L 3/12 |
| 2022/0258645 A1 * | 8/2022 | Bower .................... | B60L 58/16 |

* cited by examiner

*Primary Examiner* — Muhammad Shafi
(74) *Attorney, Agent, or Firm* — CALDWELL INTELLECTUAL PROPERTY LAW

(57) ABSTRACT

A system for predicting degradation of a battery for use in an electric vehicle is presented. The system includes a computing device communicatively connected to at least a pack monitor unit, wherein the at least a pack monitor unit is configured to detect a battery pack datum of a plurality of battery modules incorporated in a battery pack. The computing device is further configured to receive the battery pack datum as a function of the at least a pack monitor unit, generate, as a function of the battery pack datum, a battery pack model associated with the battery pack of the electric vehicle, and determine a battery degradation prediction as a function of the battery pack datum and the battery pack model.

20 Claims, 10 Drawing Sheets

SYSTEMS AND METHODS FOR PREDICTING DEGRADATION OF A BATTERY FOR USE IN AN ELECTRIC VEHICLE

CROSS-REFERENCE TO RELATED APPLICATIONS

This application is a continuation of Non-provisional application Ser. No. 17/524,265 filed on Nov. 11, 2021 and entitled "SYSTEMS AND METHODS FOR PREDICTING DEGRADATION OF A BATTERY FOR USE IN AN ELECTRIC VEHICLE," the entirety of which is incorporated herein by reference.

FIELD OF THE INVENTION

The present invention generally relates to the field of batteries. In particular, the present invention is directed to systems and methods for predicting degradation of a battery for use in an electric vehicle.

BACKGROUND

Electric vehicles rely on the energy and power from a battery. As constant use of the battery results in a gradual degradation of the battery's maximum capacity and various performances, the electric vehicle may experience reduced performance qualities that may compromise the safety of all personnel and cargo of the electric vehicle. The risks are paramount for electrically propelled vehicles such as an electric vertical takeoff and landing (eVTOL) aircraft. Testing the level of degradation of a battery may be limited to real-life operation of the electric vehicle which includes operating the electric vehicle and limit testing its battery performances.

SUMMARY OF THE DISCLOSURE

In an aspect a system for predicting a battery lifetime of a battery during use in an electric vehicle, the system including a computing device communicatively connected to at least a pack monitor unit, wherein the at least a pack monitor unit is configured to detect a battery pack datum of a plurality of battery modules incorporated in a battery pack, the computing device is configured to receive the battery pack datum as a function of the at least a pack monitor unit, generate, as a function of the battery pack datum, a digital twin including a battery pack model associated with the battery pack of the electric vehicle, receive periodic instances of battery pack data, periodically update the digital twin as a function of the received battery pack data, simulate a virtual representation of the digital twin, and predict the battery lifetime of the battery pack as a function of the virtual representation.

In another aspect, a method for predicting a battery lifetime of a battery during use in an electric vehicle, the method including detecting, by at least a pack monitor unit communicatively connected to a computing device, a battery pack datum of a plurality of battery modules incorporated in a battery pack, receiving, by the computing device, the battery pack datum from the at least a pack monitor unit, generating, as a function of the battery pack datum, a digital twin including a battery pack model associated with the battery pack of the electric vehicle, receiving, by the computing device, periodic instances of battery pack data, periodically updating, by the computing device, the digital twin as a function of the received battery pack data, simulating a virtual representation of the digital twin, and predicting, by the computing device, the battery lifetime of the battery pack as a function of the virtual representation.

These and other aspects and features of non-limiting embodiments of the present invention will become apparent to those skilled in the art upon review of the following description of specific non-limiting embodiments of the invention in conjunction with the accompanying drawings.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

The drawings are not necessarily to scale and may be illustrated by phantom lines, diagrammatic representations and fragmentary views. In certain instances, details that are not necessary for an understanding of the embodiments or that render other details difficult to perceive may have been omitted.

DETAILED DESCRIPTION

At a high level, aspects of the present disclosure are directed to systems and methods for predicting degradation of a battery for use in an electric vehicle. In an embodiment, the electric vehicle may include any electric aircraft such as an electric vertical take-off and landing (eVTOL) aircraft, unmanned aerial vehicle (UAV), drone, and the like thereof. In an embodiment, aspects of the present disclosure can be used to accurately predict the level of degradation of a battery of an electric aircraft and any vehicle. Aspects of the present disclosure can be used to inform users and pilots in advance well before the degradation of a battery of an electric vehicle is sufficiently hazardous to operate.

Aspects of the present disclosure can be used to measure a plurality of battery data within the battery pack of the electric aircraft itself before transmitting the data to a more complex computing device to generate a prediction of the degradation of a battery. This is so, at least in part, to verify if the battery pack is displaying any abnormalities or malfunctions rather than an issue of battery degradation resulting from constant usage. Aspects of the present disclosure can also be used to detect any physical qualities of the battery pack and its individual battery modules and/or battery cells. This is so, at least in part, because any battery data from the battery pack may be significant in the estimation of the battery degradation, therefore, essential to the prediction of the battery degradation in the future.

Aspects of the present disclosure allow for predicting degradation of battery using a simulator. Collecting data in order estimate the level of battery degradation may require limit testing the electric vehicle which may pose risk to the vehicle, personnel, and any cargo onboard. Aspect of the present disclosure can be used to simulate electric vehicle operation using simulated electric vehicles and measure the usage of the simulated batteries of the simulated electric vehicles and estimate the battery degradation and provide a battery degradation prediction based on simulation data. Exemplary embodiments illustrating aspects of the present disclosure are described below in the context of several specific examples.

Figure 1:
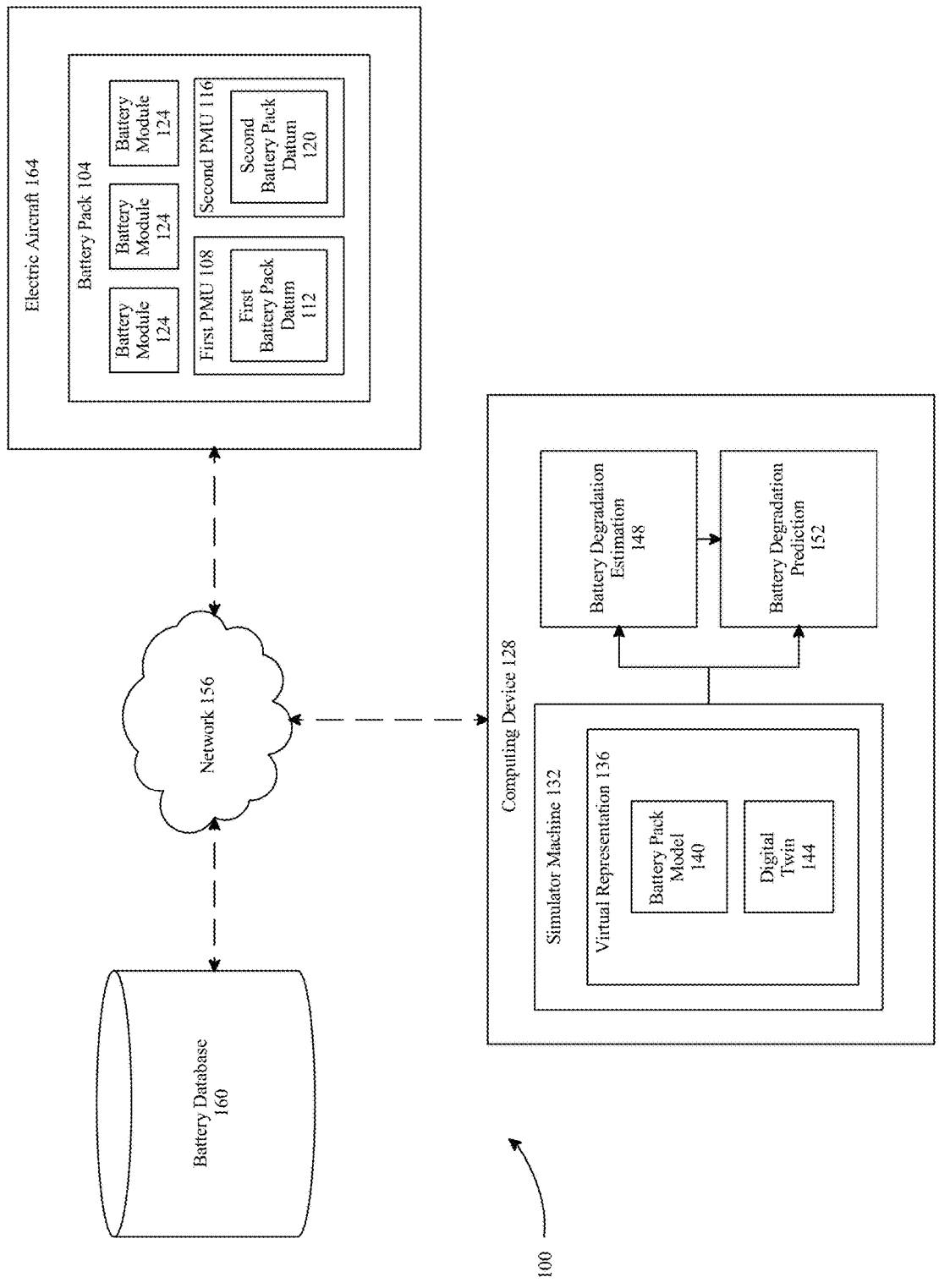
FIG. 1 is a block diagram of an exemplary embodiment of system for predicting degradation of a battery for use in an electric vehicle.

Referring now to FIG. 1, a block diagram of an exemplary embodiment of system 100 for predicting degradation of a battery for use in an electric vehicle is illustrated. In a non-limiting embodiment, the electric vehicle may include any electric vehicle such as electric aircraft 164. Electric aircraft 164 may include, but not limited to, an eVTOL aircraft. System 100 includes computing device 128. In a non-limiting embodiment, computing device 128 may include a flight controller. Computing device 128 may include any computing device as described in this disclosure, including without limitation a microcontroller, microprocessor, digital signal processor (DSP) and/or system on a chip (SoC) as described in this disclosure. Computing device may include, be included in, and/or communicate with a mobile device such as a mobile telephone or smartphone. Computing device 128 may include a single computing device operating independently, or may include two or more computing device operating in concert, in parallel, sequentially or the like; two or more computing devices may be included together in a single computing device or in two or more computing devices. Computing device 128 may interface or communicate with one or more additional devices as described below in further detail via a network interface device. Network interface device may be utilized for connecting computing device 128 to one or more of a variety of networks, and one or more devices. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network may employ a wired and/or a wireless mode of communication. In general, any network topology may be used. Information (e.g., data, software etc.) may be communicated to and/or from a computer and/or a computing device. Computing device 128 may include but is not limited to, for example, a computing device or cluster of computing devices in a first location and a second computing device or cluster of computing devices in a second location. Computing device 128 may include one or more computing devices dedicated to data storage, security, distribution of traffic for load balancing, and the like. Computing device 128 may distribute one or more computing tasks as described below across a plurality of computing devices of computing device, which may operate in parallel, in series, redundantly, or in any other manner used for distribution of tasks or memory between computing devices. computing device 128 may be implemented using a "shared nothing" architecture in which data is cached at the worker, in an embodiment, this may enable scalability of system 100 and/or computing device.

With continued reference to FIG. 1, computing device 128 may be designed and/or configured to perform any method, method step, or sequence of method steps in any embodiment described in this disclosure, in any order and with any degree of repetition. For instance, computing device 128 may be configured to perform a single step or sequence repeatedly until a desired or commanded outcome is achieved; repetition of a step or a sequence of steps may be performed iteratively and/or recursively using outputs of previous repetitions as inputs to subsequent repetitions, aggregating inputs and/or outputs of repetitions to produce an aggregate result, reduction or decrement of one or more variables such as global variables, and/or division of a larger processing task into a set of iteratively addressed smaller processing tasks. computing device 128 may perform any step or sequence of steps as described in this disclosure in parallel, such as simultaneously and/or substantially simultaneously performing a step two or more times using two or more parallel threads, processor cores, or the like; division of tasks between parallel threads and/or processes may be performed according to any protocol suitable for division of tasks between iterations. Persons skilled in the art, upon reviewing the entirety of this disclosure, will be aware of various ways in which steps, sequences of steps, processing tasks, and/or data may be subdivided, shared, or otherwise dealt with using iteration, recursion, and/or parallel processing.

With continued reference to FIG. 1, computing device 128 and/or the flight controller may be controlled by one or more Proportional-Integral-Derivative (PID) algorithms driven, for instance and without limitation by stick, rudder and/or thrust control lever with analog to digital conversion for fly by wire as described herein and related applications incorporated herein by reference. A "PID controller", for the purposes of this disclosure, is a control loop mechanism employing feedback that calculates an error value as the difference between a desired setpoint and a measured process variable and applies a correction based on proportional, integral, and derivative terms; integral and derivative terms may be generated, respectively, using analog integrators and differentiators constructed with operational amplifiers and/or digital integrators and differentiators, as a non-limiting example. A similar philosophy to attachment of flight control systems to sticks or other manual controls via pushrods and wire may be employed except the conventional surface servos, steppers, or other electromechanical actuator components may be connected to the cockpit inceptors via electrical wires. Fly-by-wire systems may be beneficial when considering the physical size of the aircraft, utility of for fly by wire for quad lift control and may be used for remote and autonomous use, consistent with the entirety of this disclosure. The computing device may harmonize vehicle flight dynamics with best handling qualities utilizing the minimum amount of complexity whether it be additional modes, augmentation, or external sensors as described herein.

With continued reference to FIG. 1, system 100 includes battery pack 104. In a non-limiting embodiment, system 100 may include a plurality of battery packs 104. A "battery pack," for the purpose of this disclosure, is a set of any number of individual battery modules 124 or identical battery modules. A "battery module", for the purpose of this disclosure, is a source of electric power consisting of one or more electrochemical cells. Battery pack 104 may include a plurality of battery cells. In a non-limiting embodiment, battery module 124 may include a battery cell and/or a plurality of battery cells. In a non-limiting embodiment, battery module 124 may be electrically connected to another battery module of a plurality of battery modules. "Electrical connection," for the purpose of this disclosure, is a link that allows of the transfer of electrical energy from one electric device to another. For example and without limitation, battery modules 124 may work in tandem with each to power a flight component. For example and without limitation, a battery module may compensate for a faulty battery module. In a non-limiting embodiment, may include at least a cell, such as a chemoelectrical, photo electric, or fuel cell. Battery pack 104 may include, without limitation, a generator, a photovoltaic device, a fuel cell such as a hydrogen fuel cell, direct methanol fuel cell, and/or solid oxide fuel cell, or an electric energy storage device; electric energy storage device may include without limitation a capacitor, an inductor, an energy storage cell and/or a battery. Plurality of battery packs 104 may be capable of providing sufficient electrical power for auxiliary loads, including without limitation lighting, navigation, communications, de-icing, steering or other systems requiring power or energy. Plurality of battery packs 104 may be capable of providing sufficient power for controlled descent and landing protocols, including without limitation hovering descent or runway landing. Plurality of battery packs may include a device for which power that may be produced per unit of volume and/or mass has been optimized, at the expense of the maximal total specific energy density or power capability, during design. Plurality of battery packs 104 may be used, in an embodiment, to provide electrical power to an electric aircraft or drone, such as an electric aircraft vehicle, during moments requiring high rates of power output, including without limitation takeoff, landing, thermal de-icing and situations requiring greater power output for reasons of stability, such as high turbulence situations. In a non-limiting embodiment, battery pack 104 may include a plurality of electrochemical cells. In a non-limiting embodiment, battery pack 104 may be configured to deliver electrical power to a plurality of electrical systems of an electric aircraft. In a non-limiting embodiment, each battery pack 104 of the plurality of battery packs may work in tandem to provide electrical energy to a plurality of electrical systems of an electric aircraft. For example and without limitation, battery pack 104 may be used to power a flight component or a set of flight components. For example and without limitation, each battery pack 104 may be used to power unique flight components or a unique set of flight components. A "flight component", for the purposes of this disclosure, is any component related to, and mechanically connected to an aircraft that manipulates a fluid medium in order to propel and maneuver the aircraft through the fluid medium. For example and without limitation, a flight component may include, propellers, vertical propulsors, forward pushers, landing gears, rudders, motors, rotors, and the like thereof.

Battery pack 104 may include a battery management system integrated into the battery pack. For instance and without limitation, battery management system may be consistent with the disclosure of any battery management system in U.S. patent application Ser. No. 17/128,798 and title SYSTEMS AND METHODS FOR A BATTERY MANAGEMENT SYSTEM INTEGRATED IN A BATTERY PACK CONFIGURED FOR USE IN ELECTRIC AIRCRAFT," which is incorporated herein by reference in its entirety. Persons skilled in the art, upon reviewing the entirety of this disclosure, will be aware of the various flight components that may represent battery pack 104 consistently with this disclosure.

With continued reference to FIG. 1, battery pack 104 may include at least a pack monitor unit (PMU). A "pack monitor unit," for the purpose of this disclosure, is a measuring device configured to capture information regarding a battery pack including battery modules. In a non-limiting embodiment, the at least a PMU may include one or more PMUs wherein each PMU is configured to detect information. In a non-limiting embodiment, the plurality of PMUs may be used to compare if the data detected is the same to confirm if at least one of the PMUs is faulty. In a non-limiting embodiment, the plurality of PMUs may be used to measure volatile data in which multiple PMUs may assist in capturing any rapid changes of a data. In a non-limiting embodiment, the at least a PMU may include a sensor. A "sensor," for the purposes of this disclosure, is an electronic device configured to detect, capture, measure, or combination thereof, a plurality of external and electric vehicle component quantities. The sensor may be integrated and/or connected to at least an actuator, a portion thereof, or any subcomponent thereof. The sensor may include a photodiode configured to convert light, heat, electromagnetic elements, and the like thereof, into electrical current for further analysis and/or manipulation. The sensor may include circuitry or electronic components configured to digitize, transform, or otherwise manipulate electrical signals. Electrical signals may include analog signals, digital signals, periodic or aperiodic signal, step signals, unit impulse signal, unit ramp signal, unit parabolic signal, signum function, exponential signal, rectangular signal, triangular signal, sinusoidal signal, sinc function, or pulse width modulated signal. The plurality of datum captured by the sensor may include circuitry, computing devices, electronic components or a combination thereof that translates into at least an electronic signal configured to be transmitted to another electronic component. The sensor may be disposed on at least an actuator of the electric aircraft. An "actuator," for the purpose of this disclosure, is any flight component or any part of an electric aircraft that helps it to achieve physical movements by converting energy, often electrical, air, or hydraulic, into mechanical force and enable movement. "Disposed," for the purpose of this disclosure, is the physical placement of a computing device on an actuator. In a non-limiting embodiment, actuator may include a flight component. In a non-limiting embodiment, the sensor may include a plurality of individual sensors disposed on each actuator of the electric aircraft. In a non-limiting embodiment, the sensor may be mechanically and communicatively connected to one or more throttles. The throttle may be any throttle as described herein, and in non-limiting examples, may include pedals, sticks, levers, buttons, dials, touch screens, one or more computing devices, and the like. Additionally, a right-hand floor-mounted lift lever may be used to control the amount of thrust provided by the lift fans or other propulsors. The rotation of a thumb wheel pusher throttle may be mounted on the end of this lever and may control the amount of torque provided by the pusher motor, or one or more other propulsors, alone or in combination. Any throttle as described herein may be consistent with any throttle described in U.S. patent application Ser. No. 16/929, 206 and titled, "Hover and Thrust Control Assembly for Dual-Mode Aircraft", which is incorporated herein in its entirety by reference. The sensor may be mechanically and communicatively connected to an inceptor stick. The pilot input may include a left-hand strain-gauge style STICK for the control of roll, pitch and yaw in both forward and assisted lift flight. A 4-way hat switch on top of the left-hand stick enables the pilot to set roll and pitch trim. Inceptor stick may include any inceptor stick as described in the entirety of this disclosure. Persons skilled in the art, upon reviewing the entirety of this disclosure, will be aware various embodiments and functions of a pilot input and inceptor stick for purposes as described herein.

With continued reference to FIG. 1, in a non-limiting embodiment, the at least a PMU may include first PMU 108. In a non-limiting embodiment, the at least a PMU may include second PMU 116. A "first pack monitor unit," for the purpose of this disclosure, is a device configured to capture information regarding a battery pack. A "second pack monitor unit," for the purpose of this disclosure, is a device configured to capture information regarding a battery pack. In a non-limiting embodiment, first PMU 108 and second PMU 116 may be identical. In a non-limiting embodiment, second PMU 116 may be configured to detect data after first PMU 108. First PMU 108 and/or second PMU 116 may include a microcontroller. The first PMU 108 and/or second PMU 116 may include a sensor wherein the sensor may include any sensor as described herein. First PMU 108 may include a first sensor suite. First sensor suite may include a plurality of individual sensors. Second PMU 116 may include a second sensor suite. Second sensor suite may include a plurality of individual sensors. In a non-limiting embodiment, first sensor suite may be identical to the second sensor suite. First PMU 108 and/or second PMU 116 may include a temperature sensor, digital temperature sensor, temperature probe, thermistors, thermocouples, and the like thereof. A "temperature sensor," for the purposes of this disclosure, is a device that detects and measure hotness and coolness of a battery pack 104 and converts it into electrical signals. In a non-limiting embodiment, first PMU 108 may be identical to second PMU 116. In a non-limiting embodiment, first PMU 108 and second PMU 116 may be configured to measure identical targets. In a non-limiting embodiment, the at least first PMU may measure a different datum of a target the at least a second monitor unit may measure. In a non-limiting embodiment, first PMU 108 and/or second PMU 116 may be used to double check measuring of datum. In a non-limiting embodiment, first PMU 108 may be configured to detect first battery pack datum 112 initially and second PMU 116 may be configured to detect a second battery pack datum 120 after a time interval and/or buffer. For example and without limitation, second PMU 116 may be configured to begin detecting a second battery pack datum 120 ten nanoseconds after first PMU 108 detects the first battery pack datum 112 For example and without limitation, second PMU 116 may be configured to begin detecting a second battery pack datum 120 sixty seconds after first PMU 108 detects the first battery pack datum 112 Persons skilled in the art, upon reviewing the entirety of this disclosure, will be aware of the various purposes of detecting with a time buffer consistent with this disclosure.

With continued reference to FIG. 1, the at least a PMU may be configured to detect a plurality of energy data. the at least a PMU may be configured to detect a battery pack datum. A "battery pack datum," for the purpose of this disclosure, is an element of data representing physical attributes of a battery pack. The battery pack datum may include an element of data representative of one or more characteristics corresponding to at least a portion of the plurality of battery packs and/or the plurality of battery modules. In a non-limiting embodiment, the battery pack datum may include at least an electrical parameter which may include, without limitation, voltage, current, impedance, resistance, and/or temperature. The battery pack datum may include a state of charge of the battery pack. A "state of charge," for the purpose of this disclosure, is a level of charge relative to capacity, for instance the state of charge may be represented proportionally or as a percentage. The battery pack datum may include a state of health of the battery pack. A "state of health," for the purpose of this disclosure, is a figure of merit compared to ideal conditions. In some cases, the state of health may be represented as a percentage, for example percentage of battery conditions matching battery specifications. Current may be measured by using a sense resistor in series with the circuit and measuring the voltage drop across the resister, or any other suitable instrumentation and/or methods for detection and/or measurement of current. Voltage may be measured using any suitable instrumentation or method for measurement of voltage, including methods for estimation as described in further detail below. Each of resistance, current, and voltage may alternatively or additionally be calculated using one or more relations between impedance and/or resistance, voltage, and current, for instantaneous, steady-state, variable, periodic, or other functions of voltage, current, resistance, and/or impedance, including without limitation Ohm's law and various other functions relating impedance, resistance, voltage, and current with regard to capacitance, inductance, and other circuit properties. In a non-limiting embodiment, the battery pack datum may include first battery pack datum 112 and second battery pack datum 120 detected by first PMU 108 and second PMU 116 respectively.

With continued reference to FIG. 1, first PMU 108 may be configured to detect first battery pack datum 112. Second PMU 116 may be configured to detect a second battery pack datum 120. A "first battery pack datum," for the purpose of this disclosure, is an element of data representing physical attributes of a battery pack detected by first PMU 108. A "second battery pack datum," for the purposes of this disclosure, is an element of data representing physical attributes of a battery pack detected by second PMU 116. In a non-limiting embodiment, first battery pack datum 112 and second battery pack datum 120 may be identical. In a non-limiting embodiment, second battery pack datum 120 may be detected after first battery pack datum 112. First battery pack datum 112 and/or second battery pack datum 120 may include an identical datum of information. Any datum or signal herein may include an electrical signal. Electrical signals may include analog signals, digital signals, periodic or aperiodic signal, step signals, unit impulse signal, unit ramp signal, unit parabolic signal, signum function, exponential signal, rectangular signal, triangular signal, sinusoidal signal, sinc function, or pulse width modulated signal. The plurality of datum captured by sensor may include circuitry, computing devices, electronic components or a combination thereof that translates into at least an electronic signal configured to be transmitted to another electronic component. First battery pack datum 112 and/or second battery pack datum 120 may include identification numbers for a battery pack unit 104 of a plurality of battery pack units. In a non-limiting embodiment, computing device 132 may assign first battery pack datum 112 and/or second battery pack datum 120 to a unique battery pack unit 104. First battery pack datum 112 and/or second battery pack datum 120 may include information describing, but not limited to, a voltage, resistance, current, impedance, distance traveled, and the like thereof. In a non-limiting embodiment, first battery pack datum 112 may be different from second battery pack datum 120. For example and without limitation, first battery pack datum 112 may include a voltage of a battery pack 104 to be 700 volts while second battery pack datum 120 may include a voltage of a battery pack 104 to be 600 volts. For example and without limitation, first battery pack datum 112 may include a current of a battery pack 104 to be 100 kWh while second battery pack datum 120 may include a voltage of a battery pack 104 to be 70 kWh volts. First battery pack datum 112 and/or second battery pack datum 120 may include a temperature datum. A "temperature datum," for the purposes of this disclosure, is any datum or element of data describing the temperature of a battery pack. Temperature datum may include a heating parameter and a cooling parameter. Heating parameter may include a rate of temperature increase of a battery pack 104. Cooling parameter may include a rate of temperature decrease of a battery pack 104. For example and without limitation, temperature datum may include a temperature of 10 to 70 degrees Fahrenheit. For example and without limitation, cooling parameter may include a temperature of a battery to be any temperature below 40 degrees Fahrenheit. For example and without limitation, heating parameter may include a temperature of a battery to be any temperature above 100 degrees Fahrenheit. In a non-limiting embodiment, the temperature datum of first battery pack datum 112 may be different from the temperature datum of second battery pack datum 120. For example and without limitation, temperature datum of first battery pack datum 112 may include a temperature of a battery pack 104 to be 60 degrees Fahrenheit while second battery pack datum 120 may include a temperature of battery pack 104 to be 100 degrees Fahrenheit. In a non-limiting embodiment, first battery pack datum 112 and/or second battery pack datum 120 may include total flight hours that battery pack 104 and/or electric aircraft have been operating. The first battery pack datum and/or second battery pack datum 120 may include total energy flowed through battery pack 104. The first battery pack datum and/or second battery pack datum 120 may include a maintenance history of the battery pack 104. The first battery pack datum and/or second battery pack datum 120 may include an upper voltage threshold. The first battery pack datum and/or second battery pack datum 120 may include a lower voltage threshold. The first battery pack datum and/or second battery pack datum 120 may include a moisture level threshold.

With continued reference to FIG. 1, first PMU 108 and/or second PMU 116 may include an isolated and/or physical controller area network (CAN) buses connected to the electric aircraft. A "physical controller area network bus," as used in this disclosure, is vehicle bus unit including a central processing unit (CPU), a CAN controller, and a transceiver designed to allow devices to communicate with each other's applications without the need of a host computer which may be located physically at the aircraft. Physical controller area network (CAN) bus unit may include physical circuit elements that may use, for instance and without limitation, twisted pair, digital circuit elements/FGPA, microcontroller, or the like to perform, without limitation, processing and/or signal transmission processes and/or tasks. For instance and without limitation, CAN bus unit may be consistent with disclosure of CAN bus unit in U.S. patent application Ser. No. 17/218,342 and titled "METHOD AND SYSTEM FOR VIRTUALIZING A PLURALITY OF CONTROLLER AREA NETWORK BUS UNITS COMMUNICATIVELY CONNECTED TO AN AIRCRAFT," which is incorporated herein by reference in its entirety. In a non-limiting embodiment, first PMU 108 may transmit first battery pack datum 112 to computing device 128 as a function of a first physical CAN bus unit. In a non-limiting embodiment, second PMU 116 may transmit second battery pack datum 120 to computing device 128 as a function of a second CAN bus unit. Persons skilled in the art, upon reviewing the entirety of this disclosure, will be aware of the plurality of physical CAN bus unit representing the first CAN bus unit and the second CAN bust unit consistent with this disclosure. Persons skilled in the art, upon reviewing the entirety of this disclosure, will be aware of the various embodiments of transferring data as a function of one or more mediums for the purposes as described herein.

With continued reference to FIG. 1, computing device 128 may be configured to receive the battery pack datum which may include first battery pack datum 112 and second battery pack datum 120. Computing device 128 may be configured to communicatively connect to network 156. A "network", for the purpose of this disclosure, is any medium configured to facilitate communication between two or more devices. Network 156 may include any network described in this disclosure, for example without limitation an avionic mesh network. In some cases, network 156 may include a mesh network. A mesh network may include, without limitation, an avionic mesh network. For instance and without limitation, the avionic mesh network may be consistent with the avionic mesh network in U.S. patent application Ser. No. 17/348,916 and titled "METHODS AND SYSTEMS FOR SIMULATED OPERATION OF AN ELECTRIC VERTICAL TAKE-OFF AND LANDING (EVTOL) AIRCRAFT," which is incorporated herein by reference in its entirety. In some embodiments, network 156 may include an intra-aircraft network and/or an inter-aircraft network. Intra-aircraft network may include any intra-aircraft network described in this disclosure. Inter-aircraft network may include any inter-aircraft network described in this disclosure.

With continued reference to FIG. 1, computing device 128 may be configured to generate, as a function of the battery pack datum such as first battery pack datum 112 and second battery pack datum 120, battery pack model 140. A "battery pack model," for the purpose of this disclosure, is a simulation and/or model of battery pack 104 of a battery pack such as, but not limited to, a battery pack incorporated in an electric aircraft that embodies an analytical and/or interactive visualization regarding operation and/or performance capabilities of battery pack 104. In a non-limiting embodiment, battery pack model 140 may include a simulation of battery pack 104 of a simulated vehicle. In a non-limiting embodiment, battery pack model may include one or more of a machine-learning model, a mathematical model, an empirical mode, a probabilistic model, an analytical model, and the like. Battery pack model 140 may be generated using digital twin 144. A "digital twin," for the purpose of this disclosure, is an up-to-date virtual representation of a physical component or process, for instance and without limitation an aircraft such as the electric vehicle. For instance and without limitation, digital twin 144 may be consistent with digital twin in U.S. patent application Ser. No. 17/348,916 and titled "METHODS AND SYSTEMS FOR SIMULATED OPERATION OF AN ELECTRIC VERTICAL TAKE-OFF AND LANDING (EVTOL) AIRCRAFT" which is incorporated herein in its entirety.

With continued reference to FIG. 1, computing device 128 may be configured to receive periodic instances of battery pack data and periodically update the battery pack model as a function of the periodic instances of battery pack data. A "battery pack data," for the purpose of this disclosure, is any element describing information of battery pack 104 and its components. In a non-limiting embodiment, the battery pack data may include a plurality of data captured in different time intervals. In a non-limiting embodiment, the battery pack data may include the battery pack datum, wherein the battery pack datum may include any battery pack datum described herein, such as first battery pack datum 112 and second battery pack datum 120. For example and without limitation, the at least a pack monitor unit may capture the battery pack data every 5 minutes. In another non-limiting example, the at least a pack monitor unit may capture the battery pack data at different modes or stages of the flight of the electric aircraft. The at least a pack monitor unit may capture the battery pack data at lift off, forward flight, and landing. For example and without limitation, the at least a pack monitor unit may measure the battery pack data when the electric aircraft transitions between vertical wing flight and fixed wing flight. Persons skilled in the art, upon reviewing the entirety of this disclosure, will be aware of the various stages, modes, and configurations of an electric aircraft and its flight for purposes as described herein.

With continued reference to FIG. 1, computing device 128 may incorporate the use of a timer module configured to provide specific time intervals for the at least a pack monitor unit to capture the battery pack data. A "timer module," for the purpose of this disclosure, is any computing device that is used to track time or count down time. In a non-limiting embodiment, the timer module may include any alarm device, stopwatch, and the like thereof. In a non-limiting embodiment, a user may manipulate the timer module and set specific time intervals for the timer module to instruct the capturing of periodic instances of the battery pack data in various stages of the electric aircraft in a flight. Persons skilled in the art, upon reviewing the entirety of this disclosure, will be aware of the various embodiments of a timer module for purposes as described herein. Additionally or alternatively, battery pack model 140 may be generated as a function of the at least a battery datum, but battery pack model 140 may remain constant throughout a flight of electric aircraft 164. For example and without limitation, computing device 128 may be receive the at least a battery datum at the initial start-up of the electric aircraft, wherein battery pack model 140 may be generated based on the at least a battery datum received at the start-up. Battery pack model 140 may represent a visual representation of battery pack 104 of electric aircraft 164 at the initial start-up, but battery pack 104 may experience various phenomena, such as power consumption, increase in temperature, etc. Battery pack model 140 may remain constant throughout the flight of electric aircraft 164 despite changes to the at least a battery datum. This is so, at least in part, to provide a simple visual representation of battery pack 104 to the pilot instead of a complicated and dynamic model constantly being modified by computing device 128 and/or simulator machine 132, which may distract the pilot. While battery pack model 140 may be constant and not necessarily modeling an accurate representation of the state of battery pack 104 continuously, computing device 128 may continuously receive parameters from battery pack 104 such as the at least a battery datum and generate battery degradation prediction 152, wherein battery degradation prediction 152 may be presented as a computer-readable format, electronic signals and/or files, etc., for analysis purposes. In a non-limiting embodiment, computing device 128 may use the timer module to generate battery pack model 140 at various time intervals instead of continuously modifying the battery pack model and generating updated models as a function of continuous receiving of inputs. In another non-limiting embodiment, battery pack model 140 may include any algorithm as described in the entirety of this disclosure.

With continued reference to FIG. 1, simulator machine 132 may be configured to simulate virtual representation 136 of digital twin 144. As described in this disclosure, a "virtual representation" includes any model or simulation accessible by computing device which is representative of a physical phenomenon, for example without limitation at least a part of an electric vehicle such as an electric vehicle and/or its battery pack, or a simulator module. For instance and without limitation, the virtual representation 136 may be consistent with virtual representation in U.S. patent application Ser. No. 17/348,916 and titled "METHODS AND SYSTEMS FOR SIMULATED OPERATION OF AN ELECTRIC VERTICAL TAKE-OFF AND LANDING (EVTOL) AIRCRAFT" which is incorporated herein in its entirety. In some cases, virtual representation may be interactive with simulator machine 132. Simulator machine 132 may include a flight simulator. For instance and without limitation, simulator machine 132 may be consistent with flight simulator in U.S. patent application Ser. No. 17/348,916 and titled "METHODS AND SYSTEMS FOR SIMULATED OPERATION OF AN ELECTRIC VERTICAL TAKE-OFF AND LANDING (EVTOL) AIRCRAFT" which is incorporated herein in its entirety. For example, in some cases, data may originate from virtual representation 136 and be input into simulator machine 132. Alternatively or additionally, in some cases, virtual representation 136 may modify or transform data already available to simulator machine 132. Virtual representation 136 may include digital twin 144 of at least an aircraft component 116. Aircraft digital twin 144 may include any digital twin as described in this disclosure, for example below. In some cases, at least an aircraft component 116 includes an electric vertical take-off and landing (eVTOL) aircraft, for example a functional flight-worthy eVTOL aircraft; and aircraft digital twin 144 is a digital twin of the eVTOL aircraft. In some cases, at least a virtual representation 136 may include a virtual controller area network. Virtual controller area network may include any virtual controller area network as described in this disclosure, for example below. In some cases, aircraft digital twin may include a flight controller model. Flight controller model may include any flight controller model described in this disclosure.

With continued reference to FIG. In some embodiments, digital twin 144 may include a battery pack model 140. Battery pack model 140 may include any model related to at least property, characteristic, or function of a battery located within aircraft. In some cases, battery pack model 140 may include a model of a battery controller, management, and/or monitoring system. Disclosure related to battery management for eVTOL aircraft may be found in patent application Ser. Nos. 17/108,798 and 17,111,002, entitled "PACK LEVEL BATTERY MANAGEMENT SYSTEM" and "ELECTRICAL DISTRIBUTION MONITORING SYSTEM FOR AN ELECTRIC AIRCRAFT," respectively, each of which is incorporated herein by reference in its entirety. In some cases, battery pack model 140 may include an electrochemical model of battery, which may be predictive of energy efficiencies and heat generation and transfer of at least a battery. In some cases, battery pack model 140 may be configured to predict battery lifetime, given known battery parameters, for example measured battery performance, temperature, utilization, and the like. In a non-limiting embodiment, battery pack model 140 may include an integrated multi-physics, multiscale, probabilistic simulation of an as-built vehicle or system that uses best available physical models, sensor updates, fleet history, and the like, to mirror the electric vehicle or at least the electric vehicle's component, for instance battery. In some cases, digital twin digital twin may be a virtual instance of the electric vehicle or the battery that is continually updated with the vehicle or battery's performance, maintenance, and health status data, for example throughout the vehicle or battery's life cycle. For example and without limitation, battery pack model 140 may further include previous prediction data associated with battery pack 104.

With continued reference to FIG. 1, in some embodiments, digital twin 144 may model, simulate, predict, and/or determine an aspect of electric aircraft 156 using machine-learning processes, including any machine-learning process described in this application. Digital twin 144 may include analytical models, for example those based upon known physical laws and phenomena, such as Newton's laws of motion. Alternatively and/or additionally, digital twin 144 may include data-driven models based largely on observed data, for example Monte-Carlo modeling and/or machine-learning processes. In some cases, digital twin 144 may be constituted of digital threads. According to some embodiments, a digital thread may be considered a lowest level design and specification for a digital representation of a physical item. Use of digital threads may, in some cases, ensure deep coherence between models of a digital twin 144. In some cases, a digital twin 144 may include a design equation and/or design matrix. A design equation may mathematically represent some or all design requirements and parameters associated with a particular design, for example an electric aircraft 156.

With continued reference to FIG. 1, battery pack model further comprises a plurality of virtual instances of the battery pack datum updated continuously. A "plurality of virtual instances," for the purpose of this disclosure, is a plurality of virtual representations 136 of battery pack 104 simulated in time intervals. In a non-limiting embodiment, the plurality of virtual instances may be used in which computing device 128 may calculate battery degradation estimation 148 which may be further used to generate battery degradation prediction. A "battery degradation estimation," is any element of data describing a value or rate describing the degrading capabilities of a battery pack of an electric aircraft. In a non-limiting embodiment, computing device 128 may calculate battery degradation estimation 138 continuously and/or dynamically throughout a duration of an operation of electric aircraft 156. In a non-limiting embodiment, computing device 128 may calculate battery degradation estimation 148. In a non-limiting embodiment, the plurality of virtual instances may include a plurality of battery pack models recorded from previous simulations of flights and/or operations of electric aircraft 156. For example and without limitation, a simulated electric aircraft operated by a simulator module may generate a simulated battery pack model of the simulated electric aircraft after the flight and landing of the simulated electric aircraft inside a simulated environment. The simulator module may operate the same simulated electric aircraft in which battery pack of the simulated electric aircraft may degrade after a plurality of simulated flights in which computing device 128 may use the plurality of virtual instances of simulated battery pack models from the plurality of simulated flights of the simulated electric aircraft to generate battery degradation estimation 148 and/or battery degradation prediction 152. In some embodiment, battery pack model 140 may include a plurality of battery pack models which may include a plurality of virtual representations of a real-life operation of an aircraft such as electric aircraft 156. Persons skilled in the art, upon reviewing the entirety of this disclosure, will be aware of the various embodiments of simulated models of data from real-life operation of a physical electric aircraft 156 or a simulation data from a simulated electric aircraft for purposes described herein. In a non-limiting embodiment, computing device 128 may use data from both real-life data and simulation data for purposes described herein.

With continued reference to FIG. 1, system 100 may include a simulator module. The simulator module may be communicatively connected to computing device 128 by any communication means described in this disclosure, for example without limitation network 112. As used in this disclosure, a "simulator module" is a physical component that is a simulation of an aircraft component. Simulator module may include actual aircraft components that have been separated from a functioning aircraft or otherwise de-activated. A simulator module may include a model or replica. In some cases, simulator module may include a physical twin of at least an aircraft component. In some cases, simulator module may include a physical cockpit. The physical cockpit may include at least an aircraft component. For example, a physical cockpit may include one or more of an aircraft interior, seating, windows, displays, pilot controls, and the like. The physical cockpit may be used to perform a simulated flight mission. As used in this disclosure, a "simulated flight mission" is any use of a simulator machine 132 that includes a simulated flight. The simulator module and/or physical cockpit may include at least a pilot control configured to interface with a user. The at least a pilot control may include any pilot control described in this disclosure. In some cases, at least one of the simulator module, the physical cockpit, and a pilot control may include at least a sensor. The at least a sensor may be communicatively connected to computing device 128. In some cases, the at least a sensor may be configured to detect a user interaction with the at least a pilot control. The at a least a sensor may include any sensor described in this disclosure.

With continued reference to FIG. 1, computing device 128 is configured to determine battery degradation prediction 152 as a function of the battery pack datum, which may further include first battery pack datum 112 and second battery pack datum 120, and battery pack model 140. A "battery degradation prediction," for the purpose of this disclosure, is a model, simulation, or element of data representing the degradation of battery pack 104 of an electric vehicle which may include electric aircraft 156. For example and without limitation, battery degradation prediction 152 may include a virtual representation of a battery pack model representing a potential degraded state of battery pack 104. For example and without limitation, battery degradation prediction 152 may include a model such as a battery degradation model. A "battery degradation model," for the purpose of this disclosure, is any virtual representation and/or battery pack model representing a predictive battery pack model describing a future degraded state of battery pack 104. In a non-limiting embodiment, the battery degradation model may include a graphical representation depicting the state of charge of battery pack 104 as a function of time. For instance and without limitation, the battery degradation model may be consistent with FIG. 7, a graph showing the state of charge of an energy source as a function of time, in U.S. patent application Ser. No. 16/599,538 and titled "SYSTEMS AND METHODS FOR IN-FLIGHT OPERATIONAL ASSESSMENT," which is incorporated in its entirety herein. In a non-limiting embodiment, computing device 128 may be configured to generate a machine-learning model, wherein the machine-learning model is configured to receive the battery pack datum as an input and output the battery degradation model as a function of a degradation training set. A "degradation training set," for the purpose of this disclosure, is a training set that includes a previous instance of a battery pack datum correlated to the simulated virtual representation and its battery pack model of that previous instance. In a non-limiting embodiment, the degradation training set may include battery degradation estimation 148. In a non-limiting embodiment, the previous instance of the battery pack datum and the previous instance of the virtual representation and its battery pack model may be retrieved from battery database 160.

With continued reference to FIG. 1, a "battery database," for the purpose of this disclosure, is a data storage system used to store any datum received and/or generated by any device within system 100. In a non-limiting embodiment, battery database 160 may include a cloud database which may be only accessed by a device such as computing device 128 in the event computing device 128 is connected to network 156. Battery database 160 may include a battery pack datum table, a battery pack model table, and/or a battery degradation prediction table. The battery pack datum table may include any data table configured to store any battery pack datum received by computing device 128. In a non-limiting embodiment, computing device 128 may retrieve a battery pack datum from the battery pack datum table of battery database 160 to use, at least in part, as a training set. The battery pack model table may include any data table configured to store any battery pack model that may be generated by computing device 128. For example and without limitation, the battery pack model table may include previous battery pack models generated in a previous flight and/or operation of electric aircraft 164 and a previous flight and/or operation of a simulated electric aircraft. In a non-limiting embodiment, computing device 128 may retrieve any battery pack model from the battery pack model table of battery database 160 to use, at least in part, as a training set. The battery degradation prediction table may include any battery degradation prediction generated by computing device 128. The battery degradation prediction table may include any data table configured to store any battery degradation prediction generated by computing device 128. For example and without limitation, computing device 128 may retrieve any battery degradation prediction from the battery degradation prediction table of battery database 160 which may be used, at least in part, as a training set. Persons skilled in the art, upon reviewing the entirety of this disclosure, will be aware of the various data and tables of a battery database for purposes described herein.

With continued reference to FIG. 1, battery degradation prediction 152 including the battery degradation prediction model may include an expected battery pack model. An "expected battery pack model," for the purpose of this disclosure, is any predictive simulation, model, or element of data describing the degradation of a battery pack of electric aircraft 164 or simulated electric aircraft. The expected battery pack model may be generated as a function of the machine-learning model.

With continued reference to FIG. 1, in a non-limiting embodiment, the generation of battery degradation prediction 152 and any model and/or any algorithm may be performed by a remote device which may include computing device 128. For example and without limitation, electric aircraft 164 and its battery pack 104 may transmit the at least a battery datum via network 156 once connected to the remote device wherein the remote device may generate battery degradation prediction 152 as a function of network 156. This is so that electric aircraft 164 may only be responsible for detecting and transmitting any battery pack datum while the remote device may be configured to perform any algorithm and/or any model generation in the cloud of network 156. In a non-limiting embodiment, generation of battery degradation prediction 152 may be conducted by a computing device disposed on electric aircraft 164. For example and without limitation, the computing device may perform and algorithm and generate any model or any prediction once connected to network 156 which the computing device disposed on electric aircraft 164 may access battery database 160, a cloud database, to retrieve the degradation training set to generate battery degradation prediction 152. In a non-limiting embodiment, the above-mentioned steps may be imitated in a simulated environment. Persons skilled in the art, upon reviewing the entirety of this disclosure, will be aware of the various embodiments of a computing device performing any computation in the context of a real-life event and/or simulated environment for purposes as described herein.

Figure 2:
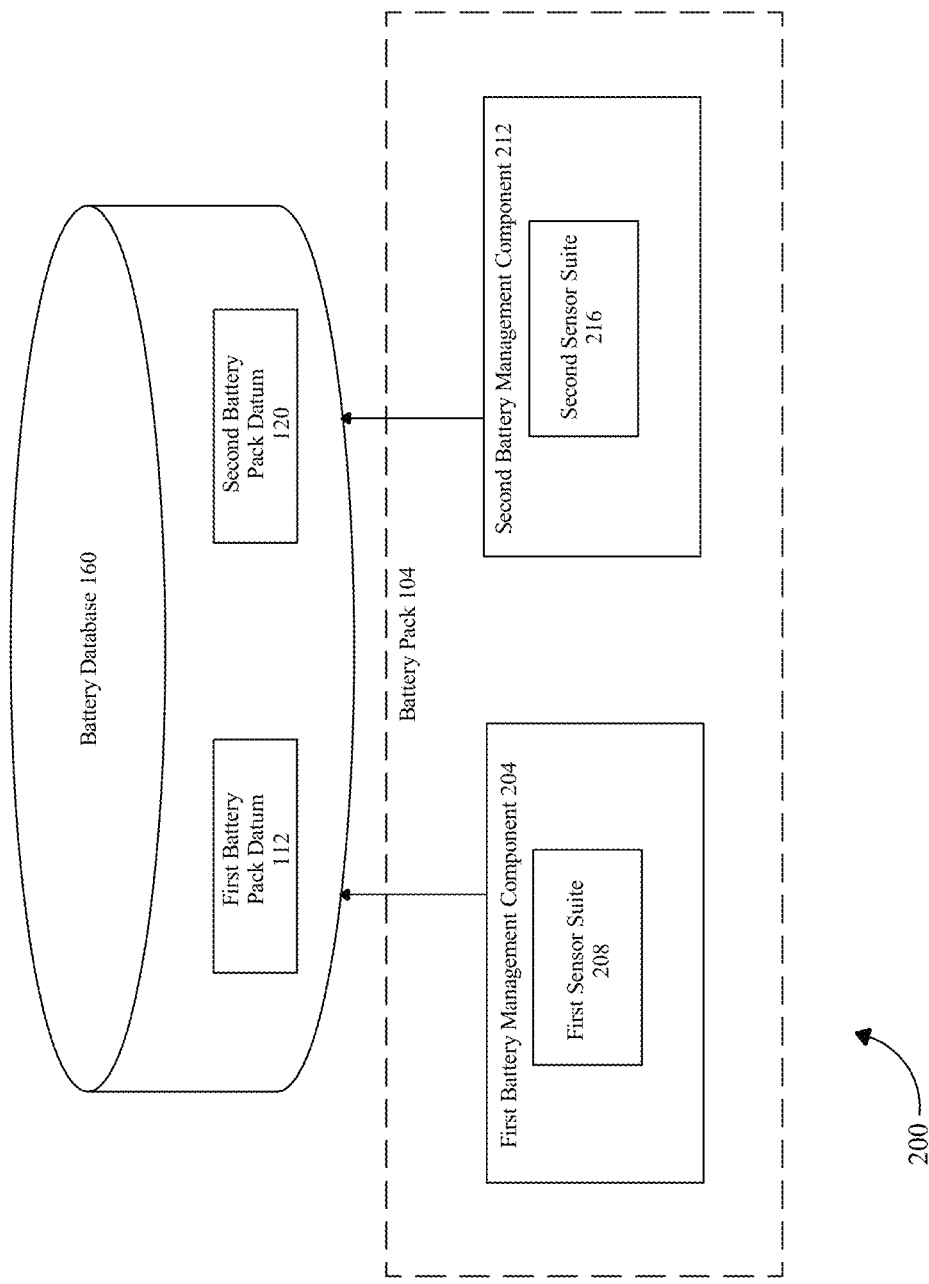
FIG. 2 is a block diagram of an exemplary embodiment of a battery management system.

Referring now to FIG. 2, an embodiment of battery management system 200 is presented. Battery management system 200 is be integrated in a battery pack 104 configured for use in an electric aircraft. The battery management system 200 is be integrated in a portion of the battery pack 104 or subassembly thereof. Battery management system 200 includes first battery management component 204 disposed on a first end of the battery pack. One of ordinary skill in the art will appreciate that there are various areas in and on a battery pack and/or subassemblies thereof that may include first battery management component 204. First battery management component 204 may take any suitable form. In a non-limiting embodiment, first battery management component 204 may include a circuit board, such as a printed circuit board and/or integrated circuit board, a subassembly mechanically coupled to at least a portion of the battery pack, standalone components communicatively coupled together, or another undisclosed arrangement of components; for instance, and without limitation, a number of components of first battery management component 204 may be soldered or otherwise electrically connected to a circuit board. First battery management component may be disposed directly over, adjacent to, facing, and/or near a battery module and specifically at least a portion of a battery cell. First battery management component 204 includes first sensor suite 208. First sensor suite 208 is configured to measure, detect, sense, and transmit first plurality of battery pack datum 112 to battery database 160.

Referring again to FIG. 2, battery management system 200 includes second battery management component 212. For instance and without limitation, battery management system may be consistent with disclosure of battery management system in U.S. patent application Ser. No. 17/108,798 and titled "SYSTEMS AND METHODS FOR A BATTERY MANAGEMENT SYSTEM INTEGRATED IN A BATTERY PACK CONFIGURED FOR USE IN ELECTRIC AIRCRAFT," which is incorporated herein by reference in its entirety. Second battery management component 212 is disposed in or on a second end of battery pack 104. Second battery management component 212 includes second sensor suite 216. Second sensor suite 216 may be consistent with the description of any sensor suite disclosed herein. Second sensor suite 216 is configured to measure second plurality of battery pack datum 120. Second plurality of battery pack datum 120 may be consistent with the description of any battery pack datum disclosed herein. Second plurality of battery pack datum 120 may additionally or alternatively include data not measured or recorded in another section of battery management system 200. Second plurality of battery pack datum 120 may be communicated to additional or alternate systems to which it is communicatively coupled. Second sensor suite 216 includes a moisture sensor consistent with any moisture sensor disclosed herein, namely moisture sensor 208.

With continued reference to FIG. 2, first battery management component 204 disposed in or on battery pack 104 may be physically isolated from second battery management component 212 also disposed on or in battery pack 104. "Physical isolation", for the purposes of this disclosure, refer to a first system's components, communicative coupling, and any other constituent parts, whether software or hardware, are separated from a second system's components, communicative coupling, and any other constituent parts, whether software or hardware, respectively. In a non-limiting embodiment, the plurality of the first and second battery management component may be outside the battery pack 104. First battery management component 204 and second battery management component 216 may perform the same or different functions in battery management system 200. In a non-limiting embodiment, the first and second battery management components perform the same, and therefore redundant functions. If, for example, first battery management component 204 malfunctions, in whole or in part, second battery management component 216 may still be operating properly and therefore battery management system 200 may still operate and function properly for electric aircraft in which it is installed. Additionally or alternatively, second battery management component 216 may power on while first battery management component 204 is malfunctioning. One of ordinary skill in the art would understand that the terms "first" and "second" do not refer to either "battery management components" as primary or secondary. In non-limiting embodiments, first battery management component 204 and second battery management component 216 may be powered on and operate through the same ground operations of an electric aircraft and through the same flight envelope of an electric aircraft. This does not preclude one battery management component, first battery management component 204, from taking over for second battery management component 216 if it were to malfunction. In non-limiting embodiments, the first and second battery management components, due to their physical isolation, may be configured to withstand malfunctions or failures in the other system and survive and operate. Provisions may be made to shield first battery management component 204 from second battery management component 216 other than physical location such as structures and circuit fuses. In non-limiting embodiments, first battery management component 204, second battery management component 216, or subcomponents thereof may be disposed on an internal component or set of components within battery pack 104, such as on battery module sense board 160.

Referring again to FIG. 2, first battery management component 204 may be electrically isolated from second battery management component 216. "Electrical isolation", for the purposes of this disclosure, refer to a first system's separation of components carrying electrical signals or electrical energy from a second system's components. First battery management component 204 may suffer an electrical catastrophe, rendering it inoperable, and due to electrical isolation, second battery management component 216 may still continue to operate and function normally, managing the battery pack of an electric aircraft. Shielding such as structural components, material selection, a combination thereof, or another undisclosed method of electrical isolation and insulation may be used, in non-limiting embodiments. For example, a rubber or other electrically insulating material component may be disposed between the electrical components of the first and second battery management components preventing electrical energy to be conducted through it, isolating the first and second battery management components from each other.

With continued reference to FIG. 2, battery management system 200 includes battery database 160. Battery database 160 is configured to store first plurality of battery pack datum 112 and second plurality of battery pack datum 120. Battery database 160 may include a database. Battery database 160 may include a solid-state memory or tape hard drive. Battery database 160 may be communicatively coupled to first battery management component 204 and second battery management component 212 and may be configured to receive electrical signals related to physical or electrical phenomenon measured and store those electrical signals as first battery pack datum 112 and second battery pack datum 120, respectively. Alternatively, battery database 160 may include more than one discrete battery databases that are physically and electrically isolated from each other. In this non-limiting embodiment, each of first battery management component 204 and second battery management component 212 may store first battery pack datum 112 and second battery pack datum 120 separately. One of ordinary skill in the art would understand the virtually limitless arrangements of data stores with which battery management system 200 could employ to store the first and second plurality of battery pack datum.

Referring again to FIG. 2, battery database 160 stores first plurality of battery pack datum 112 and second plurality of battery pack datum 120. First plurality of battery pack datum 112 and second plurality of battery pack datum 120 may include total flight hours that battery pack 104 and/or electric aircraft have been operating. The first and second plurality of battery pack datum may include total energy flowed through battery pack 104. Battery database 160 may be implemented, without limitation, as a relational database, a key-value retrieval datastore such as a NOSQL database, or any other format or structure for use as a datastore that a person skilled in the art would recognize as suitable upon review of the entirety of this disclosure. Battery database 160 may contain datasets that may be utilized by an unsupervised machine-learning model to find trends, cohorts, and shared datasets between data contained within battery database 160 and first battery pack datum 112 and/or second battery pack datum 120. In an embodiment, datasets contained within battery database 160 may be categorized and/or organized according to shared characteristics. For instance and without limitation, one or more tables contained within battery database 160 may include first battery pack datum table. First battery pack datum table may contain datasets classified to first battery pack information of first battery pack datum. First battery pack information may include datasets describing any first battery pack datum as described herein. One or more tables contained within battery database 160 may include a second battery pack datum table. second battery pack datum table may contain datasets classified to second battery pack information of second battery pack datum. Second battery pack information may include datasets describing any second battery pack datum as described herein. One or more tables contained within battery database 160 may include a comparison datum table. Comparison datum table may include datasets classified by level of comparison between first battery pack datum 112 and second battery pack datum 120. Comparison datum table may include datasets classified by the severity of the difference of the comparison of the first and second battery pack datum from the differential threshold. Battery database 160 may be communicatively coupled to sensors that detect, measure and store energy in a plurality of measurements which may include current, voltage, resistance, impedance, coulombs, watts, temperature, or a combination thereof. Additionally or alternatively, battery database 160 may be communicatively coupled to a sensor suite consistent with this disclosure to measure physical and/or electrical characteristics. Battery database 160 may be configured to store first battery pack datum 112 and second battery pack datum 120 wherein at least a portion of the data includes battery pack maintenance history. Battery pack maintenance history may include mechanical failures and technician resolutions thereof, electrical failures and technician resolutions thereof. Additionally, battery pack maintenance history may include component failures such that the overall system still functions. Battery database 160 may store the first and second battery pack datum that includes an upper voltage threshold and lower voltage threshold consistent with this disclosure. First battery pack datum 112 and second battery pack datum 120 may include a moisture level threshold. The moisture level threshold may include an absolute, relative, and/or specific moisture level threshold. Battery management system 200 may be designed to the Federal Aviation Administration (FAA)'s Design Assurance Level A (DAL-A), using redundant DAL-B subsystems.

With continued reference to FIG. 2, battery management system 200 may include a data collection system, which may include a central sensor suite which may be used for first sensor suite 208 in first battery management component 104 or second sensor suite 216 in second battery management component 112 or consistent with any sensor suite disclosed hereinabove. Data collection system includes battery database 160. Central sensor suite is configured to measure physical and/or electrical phenomena and characteristics of battery pack 104, in whole or in part. Central sensor suite then transmits electrical signals to battery database 160 to be saved. Those electrical signals are representative of first battery pack datum 112 and second battery pack datum 120. The electrical signals communicated from central sensor suite, and more moreover from the first or second battery management component 212 to which it belongs may be transformed or conditioned consistent with any signal conditioning present in this disclosure. Data collection system and more specifically first battery management component 104, may be configured to save first battery pack datum 112 and second battery pack datum 120 periodically in regular intervals to battery database 160. "Regular intervals", for the purposes of this disclosure, refers to an event taking place repeatedly after a certain amount of elapsed time. Data collection system may include first battery management component 104, which may include timer 504. Timer 504 may include a timing circuit, internal clock, or other circuit, component, or part configured to keep track of elapsed time and/or time of day. For example, in non-limiting embodiments, battery database 160 may save the first and second battery pack datum every 30 seconds, every minute, every 30 minutes, or another time period according to timer 504. Additionally or alternatively, battery database 160 may save the first and second battery pack datum after certain events occur, for example, in non-limiting embodiments, each power cycle, landing of the electric aircraft, when battery pack is charging or discharging, or scheduled maintenance periods. In non-limiting embodiments, battery pack 104 phenomena may be continuously measured and stored at an intermediary storage location, and then permanently saved by battery database 160 at a later time, like at a regular interval or after an event has taken place as disclosed hereinabove. Additionally or alternatively, battery database may be configured to save first battery pack datum 112 and second battery pack datum 120 at a predetermined time. "Predetermined time", for the purposes of this disclosure, refers to an internal clock within battery management system 200 commanding battery database 160 to save the first and second battery pack datum at that time. For example, battery database 160 may be configured to save the first and second battery pack datum at 0600 hours, 11 P.M. EDT, another time, multiple times a day, and/or the like.

Figure 3:
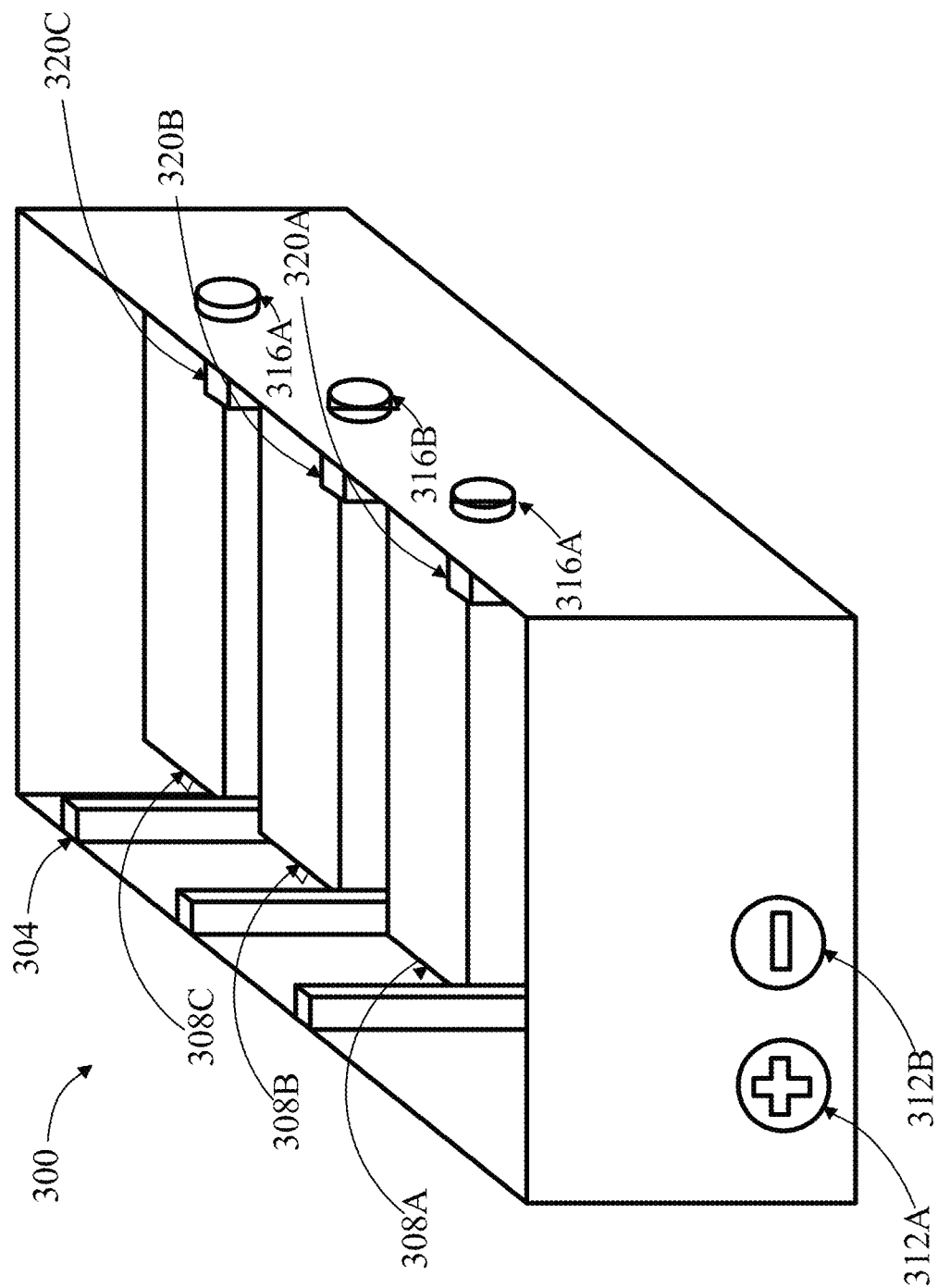
FIG. 3 is a schematic illustration of an exemplary battery pack.

Referring now to the drawings, FIG. 3 illustrates an exemplary battery pack 300. Battery pack 400 may include any battery pack described in the entirety of this disclosure. For instance and without limitation, battery pack 300 may be consistent with battery pack in U.S. patent application Ser. No. 17/319,174 and titled "SYSTEMS AND METHODS OF USE FOR A BATTERY PACK ENCLOSURE," which is incorporated by reference in its entirety. According to some embodiments, a battery pack 300 includes an outer case 304. In some cases, case 304 may be made from metal for example one or more of sheet metal, stamped metal, extruded metal, and/or machined metal. In some cases, case 304 may be formed by way of welding, brazing, and/or soldering. In some cases, case 304 may be composed wholly or in part of a relatively light and strong metal, such as without limitation aluminum alloy. As shown in FIG. 3, case 304, may include an outer case, which may substantially enclose a plurality of battery modules 308A-C. In some versions, case may provide a firewall between flammable battery modules within battery pack and an environment or vehicle surrounding the battery pack.

Continuing in reference to FIG. 3, Battery modules 308A-C may include any battery modules or battery cells described throughout this disclosure, for instance without limitation those described below. Typically, battery modules 308A-C are connected in series to one another, such that a total potential for all of the battery modules together is greater than a potential for any one of the battery modules (e.g., 308A). In some cases, a shared electrical connection from plurality of modules 308A-C may be accessible by way of an electrical connector 312A-B. In some cases, the electrical connector 312A-B may have a polarity and include a positive connection 312A and a negative connection 312B. In some cases, one or more battery modules of plurality of battery modules 308A-C may be mounted to case 304 by way of at least a breakaway mount 316A-C. In some embodiments, a breakaway mount may include any means for attachment that is configured to disconnect under a predetermined load. In some cases, breakaway mounts may be passive and rely upon loading forces for disconnection, such as exemplary breakaway mounts which may include one or more of a shear pin, a frangible nut, a frangible bolt, a breakaway nut, bolt, or stud, and the like. In some cases, a passive breakaway mount may include a relatively soft or brittle material (e.g., plastic) which is easily broken under achievable loads. Alternatively or additionally, a breakaway mount may include a notch, a score line, or another weakening feature purposefully introduced to the mount to introduce breaking at a prescribed load. According to some embodiments, a canted coil spring may be used to as part of a breakaway mount, to ensure that the mount disconnects under a predetermined loading condition. In some cases a mount may comprise a canted coil spring, a housing, and a piston; and sizes and profiles of the housing and the piston may be selected in order to prescribe a force required to disconnect the mount. An exemplary canted coil spring may be provided by Bal-Seal Engineering, Inc. of Foothill Ranch, Calif., U.S.A. Alternatively or additionally, a breakaway mount may include an active feature which is configured to actively disconnect a mount under a prescribed condition (for instance a rapid change in elevation or large measured G-forces). Much like an airbag that is configured to activate during a crash, an active mount may be configured to actively disconnect during a sensed crash. An active mount may, in some cases, include one or more of an explosive bolt, an explosive nut, an electro-magnetic connection, and the like. In some cases, one or more breakaway mounts 316A-C may be configured to disconnect under a certain loading condition, for instance a force in excess of a predetermined threshold (i.e., battery breakaway force) acting substantially along (e.g., within about +/−45°) a predetermined direction. Non-limiting exemplary battery breakaway forces may include decelerations in excess of 4, 32, 20, 50, or 300 G's.

In some embodiments, a case 304 circumscribes an inner volume, which may include a battery storage zone, for instance within which battery modules 308A-C are located, and a crush zone. As a non-limiting example, crush zone may be located between one or more battery modules 308A-C and an inner wall of case 304. In some embodiments, crush zone may be substantially empty. Alternatively, in some other embodiments, crush zone may comprise some material, such as without limitation a compressible material. In some cases, compressible material may be configured to absorb and/or dissipate energy as it is compressed. In some cases, compressible material may include a material having a number of voids; for instance, compressible material may take a form of a honeycomb or another predictably cellular form. Alternatively or additionally, compressible material may include a non-uniform material, such as without limitation a foam. In some embodiments, a crush zone may be located down from one or more battery modules 308A-C substantially along a loading direction, such that for instance the one or more battery modules when disconnected from one or more breakaway mounts 316A-C may be directed toward crush zone. In some cases, case 304 may include one or more channels or guides 320A-C configured to direct at least a battery module 308A-C into a crush zone, should it become disconnected from the case.

Still referring to FIG. 3, in some embodiments, battery module 308A-C may include Li ion batteries which may include NCA, NMC, Lithium iron phosphate (LiFePO4) and Lithium Manganese Oxide (LMO) batteries, which may be mixed with another cathode chemistry to provide more specific power if the application requires Li metal batteries, which have a lithium metal anode that provides high power on demand, Li ion batteries that have a silicon, tin nanocrystals, graphite, graphene or titanate anode, or the like. Batteries and/or battery modules may include without limitation batteries using nickel-based chemistries such as nickel cadmium or nickel metal hydride, batteries using lithium-ion battery chemistries such as a nickel cobalt aluminum (NCA), nickel manganese cobalt (NMC), lithium iron phosphate (LiFePO4), lithium cobalt oxide (LCO), and/or lithium manganese oxide (LMO), batteries using lithium polymer technology, metal-air batteries. Battery modules 308A-C may include lead-based batteries such as without limitation lead acid batteries and lead carbon batteries. Battery modules 308A-C may include lithium sulfur batteries, magnesium ion batteries, and/or sodium ion batteries. Batteries may include solid state batteries or supercapacitors or another suitable energy source. Batteries may be primary or secondary or a combination of both. Additional disclosure related to batteries and battery modules may be found in co-owned U.S. Patent Applications entitled "SYSTEM AND METHOD FOR HIGH ENERGY DENSITY BATTERY MODULE" and "SYSTEMS AND METHODS FOR RESTRICTING POWER TO A LOAD TO PREVENT ENGAGING CIRCUIT PROTECTION DEVICE FOR AN AIRCRAFT," having U.S. patent application Ser. Nos. 16/948,140 and 16/590,496 respectively; the entirety of both applications are incorporated herein by reference. Persons skilled in the art, upon reviewing the entirety of this disclosure, will be aware of various devices of components that may be used as a battery module. In some cases, case 304 is constructed in a manner that maximizes manufacturing efficiencies.

Figure 4:
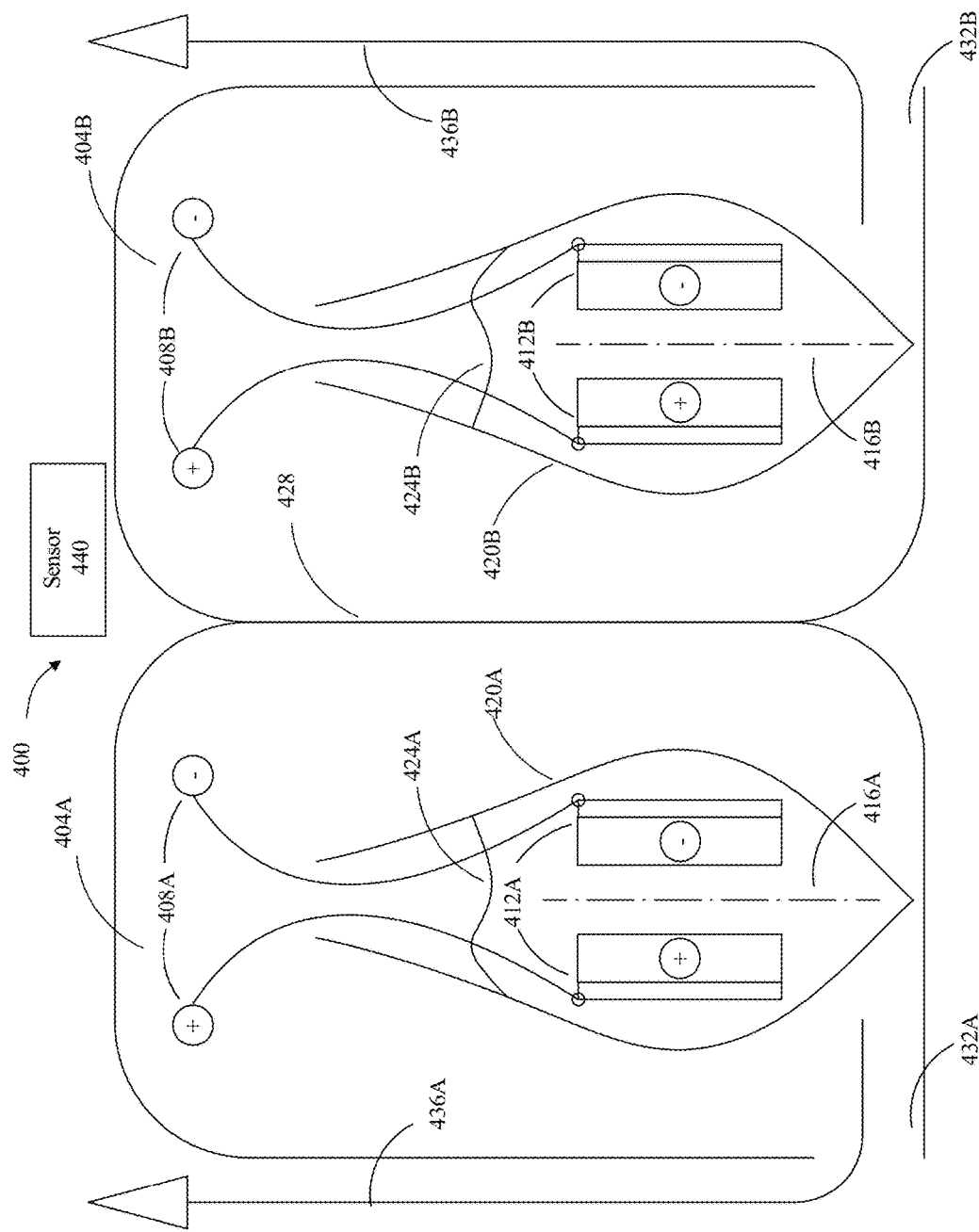
FIG. 4 is a block diagram of an exemplary battery pack for preventing progression of thermal runaway between modules.

Referring now to the drawings, FIG. 4 illustrates a block diagram of an exemplary battery pack 400 for preventing progression of thermal runaway between modules. In a non-limiting embodiment, battery pack 400 may include any battery pack as described in the entirety of this disclosure. For instance and without limitation, battery pack 400 may be consistent with battery pack in U.S. patent application Ser. No. 17/348,960 and titled "BATTERY PACK FOR ELECTRIC VERTICAL TAKE-OFF AND LANDING AIRCRAFT," which is incorporated by reference in its entirety. Battery pack 400 may include a pouch cell 404A-B. As used in this disclosure, "pouch cell" is a battery cell or module that includes a pouch. In some cases, a pouch cell may include or be referred to as a prismatic pouch cell, for example when an overall shape of pouch is prismatic. In some cases, a pouch cell may include a pouch which is substantially flexible. Alternatively or additionally, in some cases, pouch may be substantially rigid. Pouch cell 404A-B may include at least a pair of electrodes 408A-B. At least a pair of electrodes 408A-B may include a positive electrode and a negative electrode. Each electrode of at least a pair of electrodes 408A-B may include an electrically conductive element. Non-limiting exemplary electrically conductive elements include braided wire, solid wire, metallic foil, circuitry, such as printed circuit boards, and the like. At least a pair of electrodes 408A-B may be in electric communication with and/or electrically connected to at least a pair of foil tabs 412A-B. At least a pair of electrodes 408A-B may be bonded in electric communication with and/or electrically connected to at least a pair of foil tabs 412A-B by any known method, including without limitation welding, brazing, soldering, adhering, engineering fits, electrical connectors, and the like. In some cases, at least a pair of foil tabs may include a cathode and an anode. In some cases, an exemplary cathode may include a lithium-based substance, such as lithium-metal oxide, bonded to an aluminum foil tab. In some cases, an exemplary anode may include a carbon-based substance, such as graphite, bonded to a copper tab. A pouch cell 404A-B may include an insulator layer 416A-B. As used in this disclosure, an "insulator layer" is an electrically insulating material that is substantially permeable to battery ions, such as without limitation lithium ions. In some cases, insulator layer may be referred to as a separator layer or simply separator. In some cases, insulator layer 416A-B is configured to prevent electrical communication directly between at least a pair of foil tabs 412A-B (e.g., cathode and anode). In some cases, insulator layer 416A-B may be configured to allow for a flow ions across it. Insulator layer 416A-B may consist of a polymer, such as without limitation polyolefin (PO). Insulator layer 416A-B may comprise pours which are configured to allow for passage of ions, for example lithium ions. In some cases, pours of a PO insulator layer 416A-B may have a width no greater than 400 µm, 40 µm, 4 µm, or 0.1 µm. In some cases, a PO insulator layer 416A-B may have a thickness within a range of 4-400 µm, or 40-50 µm.

With continued reference to FIG. 4, pouch cell 404A-B may include a pouch 420A-B. Pouch 420A-B may be configured to substantially encompass at least a pair of foil tabs 412A-B and at least a portion of insulator layer 416A-B. In some cases, pouch 420A-B may include a polymer, such as without limitation polyethylene, acrylic, polyester, and the like. In some case, pouch 420A-B may be coated with one or more coatings. For example, in some cases, pouch may have an outer surface coated with a metalizing coating, such as an aluminum or nickel containing coating. In some cases, pouch coating be configured to electrically ground and/or isolate pouch, increase pouches impermeability, increase pouches resistance to high temperatures, increases pouches thermal resistance (insulation), and the like. An electrolyte 424A-B is located within pouch. In some cases, electrolyte 424A-B may comprise a liquid, a solid, a gel, a paste, and/or a polymer. Electrolyte may wet or contact one or both of at least a pair of foil tabs 412A-B.

With continued reference to FIG. 4, battery pack 400 may additionally include an ejecta barrier 428. Ejecta barrier may be located substantially between a first pouch cell 404A and a second pouch cell 404B. As used in this disclosure, an "ejecta barrier" is any material or structure that is configured to substantially block, contain, or otherwise prevent passage of ejecta. As used in this disclosure, "ejecta" is any material that has been ejected, for example from a battery cell. In some cases, ejecta may be ejected during thermal runaway of a battery cell. Alternatively or additionally, in some cases, eject may be ejected without thermal runaway of a battery cell. In some cases, ejecta may include lithium-based compounds. Alternatively or additionally, ejecta may include carbon-based compounds, such as without limitation carbonate esters. Ejecta may include matter in any phase or form, including solid, liquid, gas, vapor, and the like. In some cases, ejecta may undergo a phase change, for example ejecta may be vaporous as it is initially being ejected and then cool and condense into a solid or liquid after ejection. In some cases, ejecta barrier may be configured to prevent materials ejected from a first pouch cell 404A from coming into contact with a second pouch cell 404B. For example, in some instances ejecta barrier 428 is substantially impermeable to ejecta from battery pouch cell 404A-B. In some embodiments, ejecta barrier 428 may include titanium. In some embodiments, ejecta barrier 428 may include carbon fiber. In some cases, ejecta barrier 428 may include at least a one of a lithiophilic or a lithiophobic material or layer, configured to absorb and/or repel lithium-based compounds. In some cases, ejecta barrier 428 may comprise a lithiophilic metal coating, such as silver or gold. In some cases, ejecta barrier 428 may be flexible and/or rigid. In some cases, ejecta barrier 428 may include a sheet, a film, a foil, or the like. For example in some cases, ejecta barrier may be between 25 and 5,000 micrometers thick. In some cases, an ejecta barrier may have a nominal thickness of about 2 mm. Alternatively or additionally, in some cases, an ejecta barrier may include rigid and/or structural elements, for instance which are solid. Rigid ejecta barriers 428 may include metals, composites and the like. In some cases, ejecta barrier 428 may be further configured to structurally support at least a pouch cell 428. For example in some cases, at least a pouch cell 428 may be mounted to a rigid ejecta barrier 428.

With continued reference to FIG. 4, battery pack 400 may additionally include at least a vent 432A-B. In some cases, at least a vent 432A may be configured to vent ejecta from first pouch cell 404A. In some cases, at least a vent 404A may be configured to vent ejecta along a flow path 436A. A flow path 436A may substantially exclude second pouch cell 404B, for example fluids such as gases liquids, or any material that acts as a gas or liquid, flowing along the flow path 436A may be cordoned away from contact with second pouch cell 404B. For example flow path 436A may be configured to not intersect with any surface of second pouch cell 404B. Flow path 436A-B may include any channel, tube, hose, conduit, or the like suitable for facilitating fluidic communication, for example with a pouch cell 404A-B. In some cases, flow path 436A-B may include a check valve. As used in this disclosure, a "check valve" is a valve that permits flow of a fluid only in certain, for example one, direction. In some cases check valve may be configured to allow flow of fluids substantially only away from battery pouch cell 404A-B, while preventing back flow of vented fluid to the battery pouch cell 404A-B. In some cases, check valve may include a duckbill check valve. In some cases, a duckbill check valve may have lips which are substantially in a shape of a duckbill. Lips may be configured to open to allow forward flow (out of the lips), while remaining normally closed to prevent backflow (into the lips). In some cases, duckbill lips may be configured to automatically close (remain normally closed), for example with use of a compliant element, such as without limitation an elastomeric material, a spring, and the like. In some embodiments vent may include a mushroom poppet valve. In some cases, a mushroom poppet valve may include a mushroom shaped poppet. Mushroom shaped poppet may seal against a sealing element, for example a ring about an underside of a cap of the mushroom shaped poppet. In some cases, mushroom poppet valve may be loaded against sealing element, for example by way of a compliant element, such as a spring. According to some embodiments, vent 432A-B may have a vacuum applied to aid in venting of ejecta. Vacuum pressure differential may range from 0.1" Hg to 46" Hg.

With continued reference to FIG. 4, battery pack 400 may include a first battery pouch cell 404A and a second battery pouch cell 404B. First pouch cell 404A may include at least a first pair of electrodes 408A, at least a first pair of foil tabs 412A in electrical communication with the first electrodes 408A, at least a first insulator layer 416A located substantially between the at least a first pair of foil tabs 412A, a first pouch 420A substantially encompassing the at least a first pair of foil tabs 412A and at least a portion of the at least a first separator layer 416A, and a first electrolyte 424A within the first pouch 420A. Second pouch cell 404B may include at least a second pair of electrodes 408B, at least a second pair of foil tabs 412B in electrical communication with the first electrodes 408B, at least a second insulator 416B located substantially between the at least a first pair of foil tabs 412B, a second pouch 420B substantially encompassing the at least a second pair of foil tabs 412B and at least a portion of the at least a second insulator 416B, and a second electrolyte 424B within the second pouch 420B. Battery pack 400 may include an ejecta barrier 428 located substantially between first pouch cell 404A and second pouch cell 404B. Ejecta barrier 428 may be substantially impermeable to ejecta, for example ejecta from first pouch cell 404A. In some cases, battery pack 400 may include a vent configured to vent ejecta, for example from first pouch cell 404A. In some embodiments, ejecta barrier 428 may substantially encapsulates at least a portion of pouch cell 404A-B. For example, ejecta barrier 428 may substantially encapsulate first pouch cell 404A. In some cases, vent may be configured to provide fluidic communication through at least one of ejecta barrier 428 and pouch 420A-B. In some cases, vent may include a seam. Seam may be a seam of pouch 420A-B. Alternatively or additionally; seam may be a seam of ejecta barrier 428.

With continued reference to FIG. 4, in some embodiments battery pack 400 may additionally include a third pouch cell. Third pouch cell may include at least a third pair of electrodes, at least a third pair of foil tabs welded to the third electrodes, at least a third insulator layer located substantially between the at least a third pair of foil tabs, a third pouch substantially encompassing the at least a third pair of foil tabs and the at least a third separator layer, and a third electrolyte within the third pouch. Battery pack may include a plurality including any number of pouch cells. In some cases, each pouch cell of plurality of pouch cells is separated from adjacent pouch cells with at least an ejecta barrier 428. Any pouch cell of plurality of pouch cells in battery pack may include any component described in this disclosure, for example without limitation vents, valves, and the like.

Still referring to FIG. 4, in some embodiments, pouch cells 404A-B may include Li ion batteries which may include NCA, NMC, Lithium iron phosphate (LiFePO4) and Lithium Manganese Oxide (LMO) batteries, which may be mixed with another cathode chemistry to provide more specific power if the application requires Li metal batteries, which have a lithium metal anode that provides high power on demand, Li ion batteries that have a silicon, tin nanocrystals, graphite, graphene or titanate anode, or the like. Batteries and/or battery modules may include without limitation batteries using nickel-based chemistries such as nickel cadmium or nickel metal hydride, batteries using lithium-ion battery chemistries such as a nickel cobalt aluminum (NCA), nickel manganese cobalt (NMC), lithium iron phosphate (LiFePO4), lithium cobalt oxide (LCO), and/or lithium manganese oxide (LMO), batteries using lithium polymer technology, metal-air batteries. Pouch cells 404A-B may include lead-based batteries such as without limitation lead acid batteries and lead carbon batteries. Pouch cells 404A-B may include lithium sulfur batteries, magnesium ion batteries, and/or sodium ion batteries. Batteries may include solid state batteries or supercapacitors or another suitable energy source. Batteries may be primary or secondary or a combination of both. Persons skilled in the art, upon reviewing the entirety of this disclosure, will be aware of various devices of components that may be used as a battery module. In some cases, battery pack 400 is constructed in a manner that vents ejecta, while preventing ejecta from one pouch cell from interacting with another pouch cell.

Figure 5:
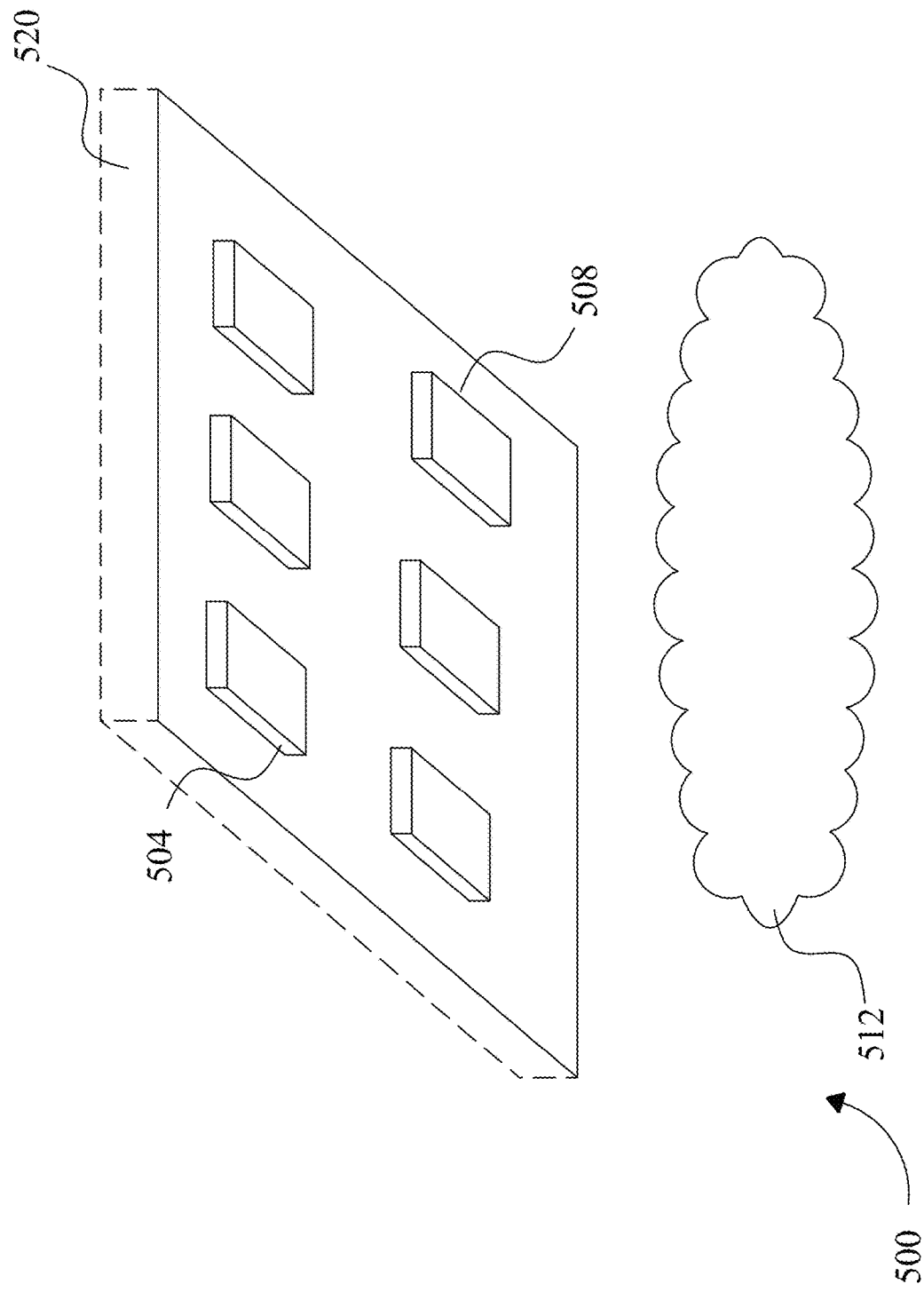
FIG. 5 is an illustration of a sensor suite in partial cut-off view.

Referring now to FIG. 5, an embodiment of sensor suite 500 is presented. The herein disclosed system and method may comprise a plurality of sensors in the form of individual sensors or a sensor suite working in tandem or individually. A sensor suite may include a plurality of independent sensors, as described herein, where any number of the described sensors may be used to detect any number of physical or electrical quantities associated with an aircraft power system or an electrical energy storage system. Independent sensors may include separate sensors measuring physical or electrical quantities that may be powered by and/or in communication with circuits independently, where each may signal sensor output to a control circuit such as a user graphical interface. In a non-limiting example, there may be four independent sensors housed in and/or on battery pack 104 measuring temperature, electrical characteristic such as voltage, amperage, resistance, or impedance, or any other parameters and/or quantities as described in this disclosure. In an embodiment, use of a plurality of independent sensors may result in redundancy configured to employ more than one sensor that measures the same phenomenon, those sensors being of the same type, a combination of, or another type of sensor not disclosed, so that in the event one sensor fails, the ability of battery management system 400 and/or user to detect phenomenon is maintained and in a non-limiting example, a user alter aircraft usage pursuant to sensor readings.

Sensor suite 500 may be suitable for use as first sensor suite 208 and/or second sensor suite 216 hereinabove. Sensor suite 500 includes a moisture sensor 504. "Moisture", as used in this disclosure, is the presence of water, this may include vaporized water in air, condensation on the surfaces of objects, or concentrations of liquid water. Moisture may include humidity. "Humidity", as used in this disclosure, is the property of a gaseous medium (almost always air) to hold water in the form of vapor. An amount of water vapor contained within a parcel of air can vary significantly. Water vapor is generally invisible to the human eye and may be damaging to electrical components. There are three primary measurements of humidity, absolute, relative, specific humidity. "Absolute humidity," for the purposes of this disclosure, describes the water content of air and is expressed in either grams per cubic meters or grams per kilogram. "Relative humidity", for the purposes of this disclosure, is expressed as a percentage, indicating a present stat of absolute humidity relative to a maximum humidity given the same temperature. "Specific humidity", for the purposes of this disclosure, is the ratio of water vapor mass to total moist air parcel mass, where parcel is a given portion of a gaseous medium. Moisture sensor 504 may be psychrometer. Moisture sensor 504 may be a hygrometer. Moisture sensor 504 may be configured to act as or include a humidistat. A "humidistat", for the purposes of this disclosure, is a humidity-triggered switch, often used to control another electronic device. Moisture sensor 504 may use capacitance to measure relative humidity and include in itself, or as an external component, include a device to convert relative humidity measurements to absolute humidity measurements. "Capacitance", for the purposes of this disclosure, is the ability of a system to store an electric charge, in this case the system is a parcel of air which may be near, adjacent to, or above a battery cell.

With continued reference to FIG. 5, sensor suite 500 may include electrical sensors 508. Electrical sensors 508 may be configured to measure voltage across a component, electrical current through a component, and resistance of a component. Electrical sensors 508 may include separate sensors to measure each of the previously disclosed electrical characteristics such as voltmeter, ammeter, and ohmmeter, respectively.

Alternatively or additionally, and with continued reference to FIG. 5, sensor suite 500 include a sensor or plurality thereof that may detect voltage and direct the charging of individual battery cells according to charge level; detection may be performed using any suitable component, set of components, and/or mechanism for direct or indirect measurement and/or detection of voltage levels, including without limitation comparators, analog to digital converters, any form of voltmeter, or the like. Sensor suite 500 and/or a control circuit incorporated therein and/or communicatively connected thereto may be configured to adjust charge to one or more battery cells as a function of a charge level and/or a detected parameter. For instance, and without limitation, sensor suite 500 may be configured to determine that a charge level of a battery cell is high based on a detected voltage level of that battery cell or portion of the battery pack. Sensor suite 500 may alternatively or additionally detect a charge reduction event, defined for purposes of this disclosure as any temporary or permanent state of a battery cell requiring reduction or cessation of charging; a charge reduction event may include a cell being fully charged and/or a cell undergoing a physical and/or electrical process that makes continued charging at a current voltage and/or current level inadvisable due to a risk that the cell will be damaged, will overheat, or the like. Detection of a charge reduction event may include detection of a temperature, of the cell above a threshold level, detection of a voltage and/or resistance level above or below a threshold, or the like. Sensor suite 500 may include digital sensors, analog sensors, or a combination thereof. Sensor suite 500 may include digital-to-analog converters (DAC), analog-to-digital converters (ADC, A/D, A-to-D), a combination thereof, or other signal conditioning components used in transmission of a first plurality of battery pack data 428 to a destination over wireless or wired connection.

With continued reference to FIG. 5, sensor suite 500 may include thermocouples, thermistors, thermometers, passive infrared sensors, resistance temperature sensors (RTD's), semiconductor based integrated circuits (IC), a combination thereof or another undisclosed sensor type, alone or in combination. Temperature, for the purposes of this disclosure, and as would be appreciated by someone of ordinary skill in the art, is a measure of the heat energy of a system. Temperature, as measured by any number or combinations of sensors present within sensor suite 500, may be measured in Fahrenheit (° F.), Celsius (° C.), Kelvin (° K), or another scale alone or in combination. The temperature measured by sensors may comprise electrical signals which are transmitted to their appropriate destination wireless or through a wired connection.

With continued reference to FIG. 5, sensor suite 500 may include a sensor configured to detect gas that may be emitted during or after a cell failure. "Cell failure", for the purposes of this disclosure, refers to a malfunction of a battery cell, which may be an electrochemical cell, that renders the cell inoperable for its designed function, namely providing electrical energy to at least a portion of an electric aircraft. Byproducts of cell failure 512 may include gaseous discharge including oxygen, hydrogen, carbon dioxide, methane, carbon monoxide, a combination thereof, or another undisclosed gas, alone or in combination. Further the sensor configured to detect vent gas from electrochemical cells may comprise a gas detector. For the purposes of this disclosure, a "gas detector" is a device used to detect a gas is present in an area. Gas detectors, and more specifically, the gas sensor that may be used in sensor suite 500, may be configured to detect combustible, flammable, toxic, oxygen depleted, a combination thereof, or another type of gas alone or in combination. The gas sensor that may be present in sensor suite 500 may include a combustible gas, photoionization detectors, electrochemical gas sensors, ultrasonic sensors, metal-oxide-semiconductor (MOS) sensors, infrared imaging sensors, a combination thereof, or another undisclosed type of gas sensor alone or in combination. Sensor suite 500 may include sensors that are configured to detect non-gaseous byproducts of cell failure 512 including, in non-limiting examples, liquid chemical leaks including aqueous alkaline solution, ionomer, molten phosphoric acid, liquid electrolytes with redox shuttle and ionomer, and salt water, among others. Sensor suite 500 may include sensors that are configured to detect non-gaseous byproducts of cell failure 512 including, in non-limiting examples, electrical anomalies as detected by any of the previous disclosed sensors or components.

With continued reference to FIG. 5, sensor suite 500 may be configured to detect events where voltage nears an upper voltage threshold or lower voltage threshold. The upper voltage threshold may be stored in battery database 160 for comparison with an instant measurement taken by any combination of sensors present within sensor suite 500. The upper voltage threshold may be calculated and calibrated based on factors relating to battery cell health, maintenance history, location within battery pack, designed application, and type, among others. Sensor suite 500 may measure voltage at an instant, over a period of time, or periodically. Sensor suite 500 may be configured to operate at any of these detection modes, switch between modes, or simultaneous measure in more than one mode. First battery management component 404 may detect through sensor suite 500 events where voltage nears the lower voltage threshold. The lower voltage threshold may indicate power loss to or from an individual battery cell or portion of the battery pack. First battery management component 404 may detect through sensor suite 500 events where voltage exceeds the upper and lower voltage threshold. Events where voltage exceeds the upper and lower voltage threshold may indicate battery cell failure or electrical anomalies that could lead to potentially dangerous situations for aircraft and personnel that may be present in or near its operation.

Figure 6:
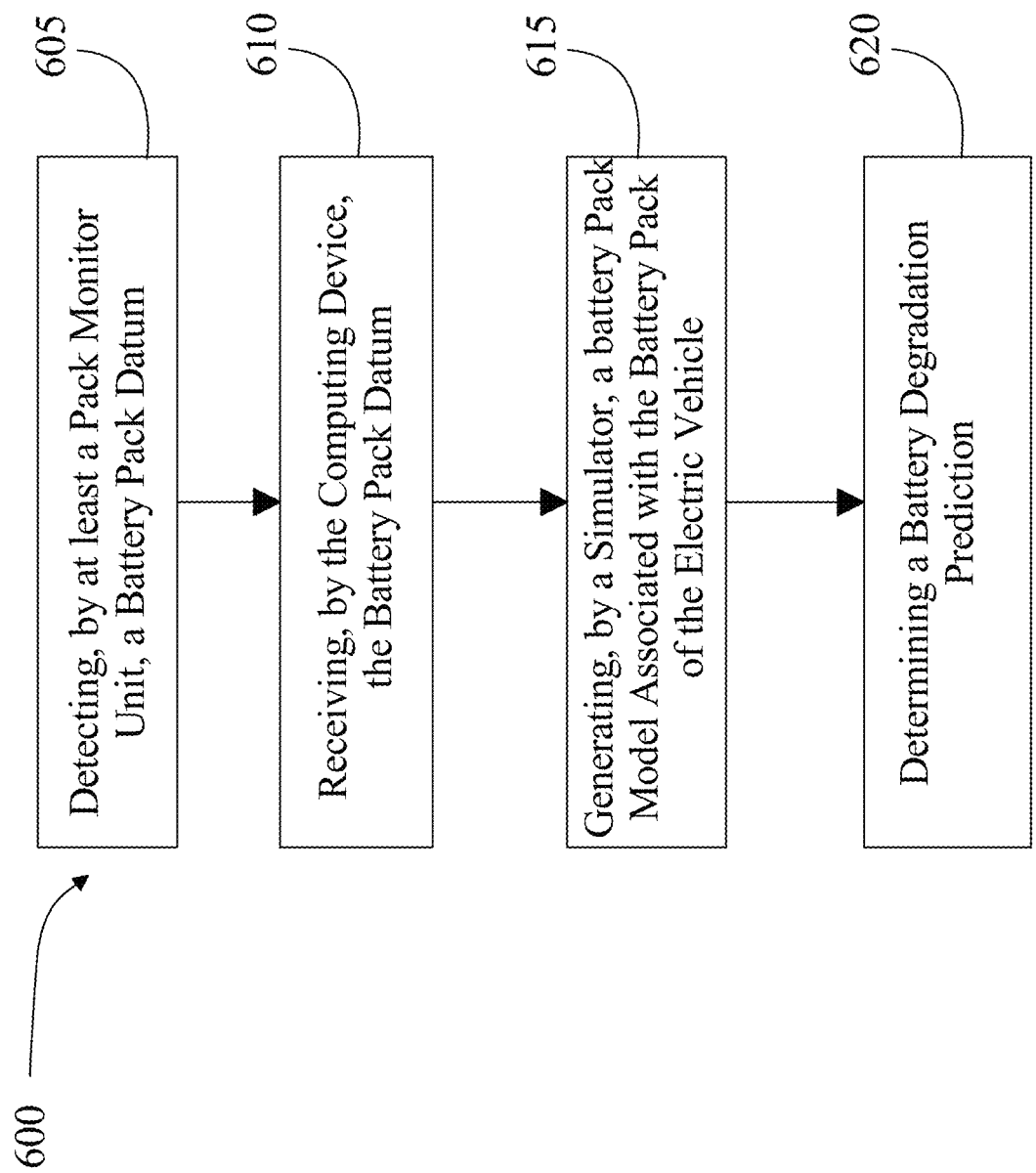
FIG. 6 is a flow diagram of an exemplary method for predicting degradation of a battery for use in an electric vehicle.

Now referring to FIG. 6, a flow diagram of an exemplary method 600 for predicting degradation of a battery for use in an electric vehicle is provided. Method 600 may include a method for predicting degradation of a battery for use in any electric vehicle such as an electric aircraft. Method 600, at step 605, includes detecting, by at least a pack monitor unit (PMU), a battery pack datum of a battery pack. In a non-limiting embodiment, the at least a pack monitor unit may include a first PMU and a second PMU. The at least a PMU may include any sensor as described in the entirety of this disclosure. The battery pack datum may include any battery pack datum as described herein. In a non-limiting embodiment, method 600, at step 605, may include detecting by the first PMU a first battery pack datum. The first battery pack datum may include any first battery pack datum as described herein. In a non-limiting embodiment, method 600, at step 605, may include detecting by the second PMU a second battery pack datum. The second battery pack datum may include any second battery pack datum as described herein. In a non-limiting embodiment, detecting the first battery pack datum and second battery pack datum may include detecting data from the same battery pack in which the first battery pack datum and second battery pack datum are the same. In a non-limiting embodiment, method 600, at step 605, include checking for any battery abnormalities as an initial screening before determining a battery degradation prediction by a computing device. In a non-limiting embodiment, detecting the battery pack datum may include detecting a state of charge of the battery pack. The state of charge of the battery pack may include any state of charge of the battery pack described herein. In a non-limiting embodiment, detecting the battery pack datum may include detecting a state of health of the battery pack. The state of health of the battery pack may include any state of health of the battery pack described herein. Persons skilled in the art, upon reviewing the entirety of this disclosure, will be aware of the various methods and types of data in the detecting of battery data for purposes as described herein.

With continued reference to FIG. 6, method 600, may include communicatively connecting a computing device to a network. The computing device may include a flight controller. The computing device may include any computing device as described herein. The flight controller may include any flight controller as described herein. The network may include any network as described herein. In a non-limiting embodiment, the network may include a mesh network, such as an avionic mesh network. The avionic mesh network may include any avionic mesh network as described herein. In a non-limiting embodiment, method 600, may include authenticating the computing device before connecting the network. For example and without limitation, the computing device may be disposed onto the electric aircraft wherein the electric aircraft may attempt to connect to the network to transmit any data detected for calculation or manipulation. In a non-limiting embodiment, method 600 may include connecting to as a function of at least a physical CAN bus unit. The at least a physical CAN bus unit may include any physical CAN bus unit as described herein. For example and without limitation, the battery pack may be connected to the computing device by any voltage ring bus, wherein the bus element may include a first physical CAN bus unit and a second physical CAN bus unit in which the first PMU may be configured to transmit the first battery pack datum to the computing device via the first physical CAN bus unit and the second PMU may be configured to transmit the second battery pack datum to the computing device via the second physical CAN bus unit.

With continued reference to FIG. 6, method 600, at step 710, includes receiving, by the computing device, the battery pack datum from the at least a pack monitor unit. In a non-limiting embodiment, method 600, at step 710, may include receiving the battery pack datum as a function of the connection to the network. Receiving the battery pack datum may include a remote device receiving the battery pack datum for any computation of data once a connection with the network is established.

With continued reference to FIG. 6, method 600, at step 715, includes generating, by a simulator machine, a battery pack model associated with the battery pack of the electric vehicle as a function of the battery pack datum. The simulator machine may include any simulator machine as described herein. The battery pack model may include any battery pack model as described herein. In a non-limiting embodiment, method 600, at step 615, may include simulating, by the simulator machine, a virtual representation of a digital twin, wherein the digital twin further comprises the battery pack model. The virtual representation may include any virtual representation as described herein. The digital twin may include any digital twin as described herein. In a non-limiting embodiment, method 600 may be used in a simulated environment of a simulated electric aircraft using a simulator module. The simulator module may include any simulator module as described herein. In a non-limiting embodiment, method 600, at step 615, may include simulating a plurality of virtual instances of the battery pack datum updated continuously. The plurality of virtual instances may include any plurality of virtual instances as described herein.

With continued reference to FIG. 6, method 600, at step 620, includes determining, by the computing device, a battery degradation prediction as a function of the battery pack datum and the battery pack model. The battery degradation prediction may include any battery degradation prediction as described herein. In a non-limiting embodiment, method 600 may include generating a machine-learning model, wherein the machine-learning model is configured to receive the battery pack datum as an input and output a battery degradation model as a function of a degradation training set. The battery degradation model may include any battery degradation model as described herein. The machine-learning model may include any machine-learning model as described herein. The degradation training set may include any degradation training set. In a non-limiting embodiment, generating the battery degradation prediction may include generating the battery degradation prediction as a function of a plurality of battery pack models. In a non-limiting embodiment, method 600 may include storing the battery pack datum in a battery database and storing the battery pack model in the battery database. The battery database may include any battery database as described herein. For example and without limitation, method 600, at step 620, may include retrieving data from the battery database as a training set for the machine-learning model. Persons skilled in the art, upon reviewing the entirety of this disclosure, will be aware of the various methods and embodiments for simulation for purposes as described herein.

Figure 7:
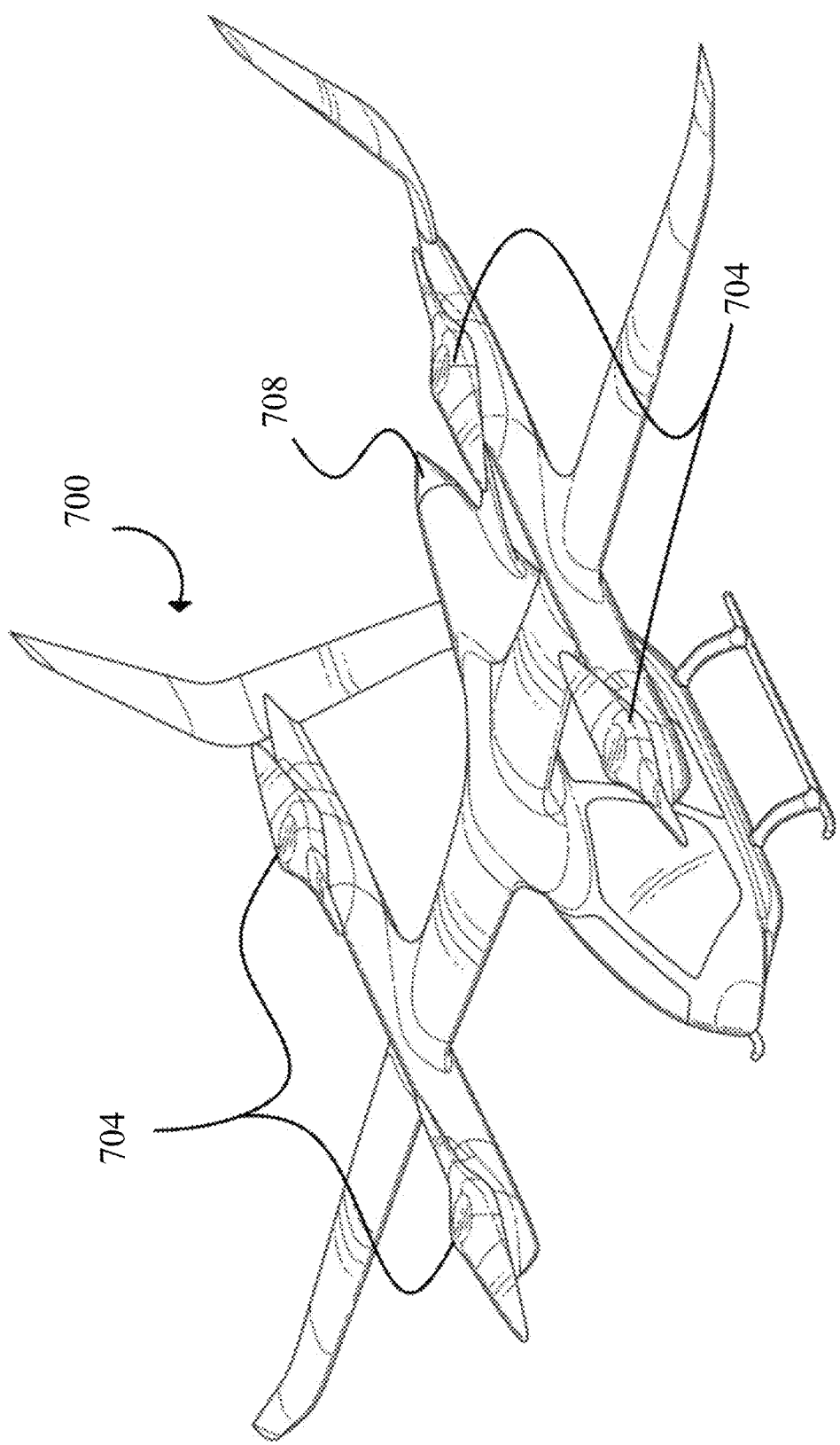
FIG. 7 is a schematic representation of an exemplary electric vertical take-off and landing vehicle.

Referring now to FIG. 7, an exemplary embodiment of an electric aircraft 700, which may include, or be incorporated with, a system for optimization of a recharging flight plan is illustrated. As used in this disclosure an "aircraft" is any vehicle that may fly by gaining support from the air. As a non-limiting example, aircraft may include airplanes, helicopters, commercial and/or recreational aircrafts, instrument flight aircrafts, drones, electric aircrafts, airliners, rotorcrafts, vertical takeoff and landing aircrafts, jets, airships, blimps, gliders, paramotors, and the like thereof.

Still referring to FIG. 7, aircraft 700 may include an electrically powered aircraft. In embodiments, electrically powered aircraft may be an electric vertical takeoff and landing (eVTOL) aircraft. Aircraft 700 may include an unmanned aerial vehicle and/or a drone. Electric aircraft may be capable of rotor-based cruising flight, rotor-based takeoff, rotor-based landing, fixed-wing cruising flight, airplane-style takeoff, airplane-style landing, and/or any combination thereof. Electric aircraft may include one or more manned and/or unmanned aircrafts. Electric aircraft may include one or more all-electric short takeoff and landing (eSTOL) aircrafts. For example, and without limitation, eSTOL aircrafts may accelerate the plane to a flight speed on takeoff and decelerate the plane after landing. In an embodiment, and without limitation, electric aircraft may be configured with an electric propulsion assembly. For purposes of description herein, the terms "upper", "lower", "left", "rear", "right", "front", "vertical", "horizontal", "upward", "downward", "forward", "backward" and derivatives thereof shall relate to the invention as oriented in FIG. 7.

Still referring to FIG. 7, aircraft 700 includes a fuselage 704. As used in this disclosure a "fuselage" is the main body of an aircraft, or in other words, the entirety of the aircraft except for the cockpit, nose, wings, empennage, nacelles, any and all control surfaces, and generally contains an aircraft's payload. Fuselage 704 may include structural elements that physically support a shape and structure of an aircraft. Structural elements may take a plurality of forms, alone or in combination with other types. Structural elements may vary depending on a construction type of aircraft such as without limitation a fuselage 704. Fuselage 704 may comprise a truss structure. A truss structure may be used with a lightweight aircraft and comprises welded steel tube trusses. A "truss," as used in this disclosure, is an assembly of beams that create a rigid structure, often in combinations of triangles to create three-dimensional shapes. A truss structure may alternatively comprise wood construction in place of steel tubes, or a combination thereof. In embodiments, structural elements may comprise steel tubes and/or wood beams. In an embodiment, and without limitation, structural elements may include an aircraft skin. Aircraft skin may be layered over the body shape constructed by trusses. Aircraft skin may comprise a plurality of materials such as plywood sheets, aluminum, fiberglass, and/or carbon fiber, the latter of which will be addressed in greater detail later herein.

In embodiments, and with continued reference to FIG. 7, aircraft fuselage 704 may include and/or be constructed using geodesic construction. Geodesic structural elements may include stringers wound about formers (which may be alternatively called station frames) in opposing spiral directions. A "stringer," as used in this disclosure, is a general structural element that includes a long, thin, and rigid strip of metal or wood that is mechanically coupled to and spans a distance from, station frame to station frame to create an internal skeleton on which to mechanically couple aircraft skin. A former (or station frame) may include a rigid structural element that is disposed along a length of an interior of aircraft fuselage 704 orthogonal to a longitudinal (nose to tail) axis of the aircraft and may form a general shape of fuselage 704. A former may include differing cross-sectional shapes at differing locations along fuselage 704, as the former is the structural element that informs the overall shape of a fuselage 704 curvature. In embodiments, aircraft skin may be anchored to formers and strings such that the outer mold line of a volume encapsulated by formers and stringers comprises the same shape as aircraft 700 when installed. In other words, former(s) may form a fuselage's ribs, and the stringers may form the interstitials between such ribs. The spiral orientation of stringers about formers may provide uniform robustness at any point on an aircraft fuselage such that if a portion sustains damage, another portion may remain largely unaffected. Aircraft skin may be mechanically coupled to underlying stringers and formers and may interact with a fluid, such as air, to generate lift and perform maneuvers.

In an embodiment, and still referring to FIG. 7, fuselage 704 may include and/or be constructed using monocoque construction. Monocoque construction may include a primary structure that forms a shell (or skin in an aircraft's case) and supports physical loads. Monocoque fuselages are fuselages in which the aircraft skin or shell is also the primary structure. In monocoque construction aircraft skin would support tensile and compressive loads within itself and true monocoque aircraft can be further characterized by the absence of internal structural elements. Aircraft skin in this construction method is rigid and can sustain its shape with no structural assistance form underlying skeleton-like elements. Monocoque fuselage may comprise aircraft skin made from plywood layered in varying grain directions, epoxy-impregnated fiberglass, carbon fiber, or any combination thereof.

According to embodiments, and further referring to FIG. 7, fuselage 704 may include a semi-monocoque construction. Semi-monocoque construction, as used herein, is a partial monocoque construction, wherein a monocoque construction is describe above detail. In semi-monocoque construction, aircraft fuselage 704 may derive some structural support from stressed aircraft skin and some structural support from underlying frame structure made of structural elements. Formers or station frames can be seen running transverse to the long axis of fuselage 704 with circular cutouts which are generally used in real-world manufacturing for weight savings and for the routing of electrical harnesses and other modern on-board systems. In a semi-monocoque construction, stringers are thin, long strips of material that run parallel to fuselage's long axis. Stringers may be mechanically coupled to formers permanently, such as with rivets. Aircraft skin may be mechanically coupled to stringers and formers permanently, such as by rivets as well. A person of ordinary skill in the art will appreciate, upon reviewing the entirety of this disclosure, that there are numerous methods for mechanical fastening of the aforementioned components like screws, nails, dowels, pins, anchors, adhesives like glue or epoxy, or bolts and nuts, to name a few. A subset of fuselage under the umbrella of semi-monocoque construction includes unibody vehicles. Unibody, which is short for "unitized body" or alternatively "unitary construction", vehicles are characterized by a construction in which the body, floor plan, and chassis form a single structure. In the aircraft world, unibody may be characterized by internal structural elements like formers and stringers being constructed in one piece, integral to the aircraft skin as well as any floor construction like a deck.

Still referring to FIG. 7, stringers and formers, which may account for the bulk of an aircraft structure excluding monocoque construction, may be arranged in a plurality of orientations depending on aircraft operation and materials. Stringers may be arranged to carry axial (tensile or compressive), shear, bending or torsion forces throughout their overall structure. Due to their coupling to aircraft skin, aerodynamic forces exerted on aircraft skin will be transferred to stringers. A location of said stringers greatly informs the type of forces and loads applied to each and every stringer, all of which may be handled by material selection, cross-sectional area, and mechanical coupling methods of each member. A similar assessment may be made for formers. In general, formers may be significantly larger in cross-sectional area and thickness, depending on location, than stringers. Both stringers and formers may comprise aluminum, aluminum alloys, graphite epoxy composite, steel alloys, titanium, or an undisclosed material alone or in combination.

In an embodiment, and still referring to FIG. 7, stressed skin, when used in semi-monocoque construction is the concept where the skin of an aircraft bears partial, yet significant, load in an overall structural hierarchy. In other words, an internal structure, whether it be a frame of welded tubes, formers and stringers, or some combination, may not be sufficiently strong enough by design to bear all loads. The concept of stressed skin may be applied in monocoque and semi-monocoque construction methods of fuselage 704.

Monocoque comprises only structural skin, and in that sense, aircraft skin undergoes stress by applied aerodynamic fluids imparted by the fluid. Stress as used in continuum mechanics may be described in pound-force per square inch (lbf/in$^2$) or Pascals (Pa). In semi-monocoque construction stressed skin may bear part of aerodynamic loads and additionally may impart force on an underlying structure of stringers and formers.

Still referring to FIG. 7, it should be noted that an illustrative embodiment is presented only, and this disclosure in no way limits the form or construction method of a system and method for loading payload into an eVTOL aircraft. In embodiments, fuselage 704 may be configurable based on the needs of the eVTOL per specific mission or objective. The general arrangement of components, structural elements, and hardware associated with storing and/or moving a payload may be added or removed from fuselage 704 as needed, whether it is stowed manually, automatedly, or removed by personnel altogether. Fuselage 704 may be configurable for a plurality of storage options. Bulkheads and dividers may be installed and uninstalled as needed, as well as longitudinal dividers where necessary. Bulkheads and dividers may be installed using integrated slots and hooks, tabs, boss and channel, or hardware like bolts, nuts, screws, nails, clips, pins, and/or dowels, to name a few. Fuselage 704 may also be configurable to accept certain specific cargo containers, or a receptable that can, in turn, accept certain cargo containers.

Still referring to FIG. 7, aircraft 700 may include a plurality of laterally extending elements attached to fuselage 704. As used in this disclosure a "laterally extending element" is an element that projects essentially horizontally from fuselage, including an outrigger, a spar, and/or a fixed wing that extends from fuselage. Wings may be structures which include airfoils configured to create a pressure differential resulting in lift. Wings may generally dispose on the left and right sides of the aircraft symmetrically, at a point between nose and empennage. Wings may comprise a plurality of geometries in planform view, swept swing, tapered, variable wing, triangular, oblong, elliptical, square, among others. A wing's cross section geometry may comprise an airfoil. An "airfoil" as used in this disclosure is a shape specifically designed such that a fluid flowing above and below it exert differing levels of pressure against the top and bottom surface. In embodiments, the bottom surface of an aircraft can be configured to generate a greater pressure than does the top, resulting in lift. Laterally extending element may comprise differing and/or similar cross-sectional geometries over its cord length or the length from wing tip to where wing meets the aircraft's body. One or more wings may be symmetrical about the aircraft's longitudinal plane, which comprises the longitudinal or roll axis reaching down the center of the aircraft through the nose and empennage, and the plane's yaw axis. Laterally extending element may comprise controls surfaces configured to be commanded by a pilot or pilots to change a wing's geometry and therefore its interaction with a fluid medium, like air. Control surfaces may comprise flaps, ailerons, tabs, spoilers, and slats, among others. The control surfaces may dispose on the wings in a plurality of locations and arrangements and in embodiments may be disposed at the leading and trailing edges of the wings, and may be configured to deflect up, down, forward, aft, or a combination thereof. An aircraft, including a dual-mode aircraft may comprise a combination of control surfaces to perform maneuvers while flying or on ground.

Still referring to FIG. 7, aircraft 700 includes a plurality of flight components 708. As used in this disclosure a "flight component" is a component that promotes flight and guidance of an aircraft. In an embodiment, flight component 708 may be mechanically coupled to an aircraft. As used herein, a person of ordinary skill in the art would understand "mechanically coupled" to mean that at least a portion of a device, component, or circuit is connected to at least a portion of the aircraft via a mechanical coupling. Said mechanical coupling can include, for example, rigid coupling, such as beam coupling, bellows coupling, bushed pin coupling, constant velocity, split-muff coupling, diaphragm coupling, disc coupling, donut coupling, elastic coupling, flexible coupling, fluid coupling, gear coupling, grid coupling, hirth joints, hydrodynamic coupling, jaw coupling, magnetic coupling, Oldham coupling, sleeve coupling, tapered shaft lock, twin spring coupling, rag joint coupling, universal joints, or any combination thereof. In an embodiment, mechanical coupling may be used to connect the ends of adjacent parts and/or objects of an electric aircraft. Further, in an embodiment, mechanical coupling may be used to join two pieces of rotating electric aircraft components.

Still referring to FIG. 7, plurality of flight components 708 may include at least a lift propulsor component 712. As used in this disclosure a "lift propulsor component" is a component and/or device used to propel a craft upward by exerting downward force on a fluid medium, which may include a gaseous medium such as air or a liquid medium such as water. Lift propulsor component 712 may include any device or component that consumes electrical power on demand to propel an electric aircraft in a direction or other vehicle while on ground or in-flight. For example, and without limitation, lift propulsor component 712 may include a rotor, propeller, paddle wheel and the like thereof, wherein a rotor is a component that produces torque along the longitudinal axis, and a propeller produces torquer along the vertical axis. In an embodiment, lift propulsor component 712 includes a plurality of blades. As used in this disclosure a "blade" is a propeller that converts rotary motion from an engine or other power source into a swirling slipstream. In an embodiment, blade may convert rotary motion to push the propeller forwards or backwards. In an embodiment lift propulsor component 712 may include a rotating power-driven hub, to which are attached several radial airfoil-section blades such that the whole assembly rotates about a longitudinal axis. Blades may be configured at an angle of attack, wherein an angle of attack is described in detail below. In an embodiment, and without limitation, angle of attack may include a fixed angle of attack. As used in this disclosure a "fixed angle of attack" is fixed angle between a chord line of a blade and relative wind. As used in this disclosure a "fixed angle" is an angle that is secured and/or unmovable from the attachment point. For example, and without limitation fixed angle of attack may be 3.2° as a function of a pitch angle of 19.7° and a relative wind angle 16.5°. In another embodiment, and without limitation, angle of attack may include a variable angle of attack. As used in this disclosure a "variable angle of attack" is a variable and/or moveable angle between a chord line of a blade and relative wind. As used in this disclosure a "variable angle" is an angle that is moveable from an attachment point. For example, and without limitation variable angle of attack may be a first angle of 7.7° as a function of a pitch angle of 17.1° and a relative wind angle 16.4°, wherein the angle adjusts and/or shifts to a second angle of 16.7° as a function of a pitch angle of 16.1° and a relative wind angle 16.4°. In an embodiment, angle of attack be configured to produce a fixed pitch angle. As used in this disclosure a "fixed pitch angle" is a fixed angle between a cord line of a blade and the rotational velocity direction. For example, and without limitation, fixed pitch angle may include 18°. In another embodiment fixed angle of attack may be manually variable to a few set positions to adjust one or more lifts of the aircraft prior to flight. In an embodiment, blades for an aircraft are designed to be fixed to their hub at an angle similar to the thread on a screw makes an angle to the shaft; this angle may be referred to as a pitch or pitch angle which will determine a speed of forward movement as the blade rotates.

In an embodiment, and still referring to FIG. 7, lift propulsor component 712 may be configured to produce a lift. As used in this disclosure a "lift" is a perpendicular force to the oncoming flow direction of fluid surrounding the surface. For example, and without limitation relative air speed may be horizontal to aircraft 700, wherein lift force may be a force exerted in a vertical direction, directing aircraft 700 upwards. In an embodiment, and without limitation, lift propulsor component 712 may produce lift as a function of applying a torque to lift propulsor component. As used in this disclosure a "torque" is a measure of force that causes an object to rotate about an axis in a direction. For example, and without limitation, torque may rotate an aileron and/or rudder to generate a force that may adjust and/or affect altitude, airspeed velocity, groundspeed velocity, direction during flight, and/or thrust. For example, one or more flight components such as a power sources may apply a torque on lift propulsor component 712 to produce lift. As used in this disclosure a "power source" is a source that that drives and/or controls any other flight component. For example, and without limitation power source may include a motor that operates to move one or more lift propulsor components, to drive one or more blades, or the like thereof. A motor may be driven by direct current (DC) electric power and may include, without limitation, brushless DC electric motors, switched reluctance motors, induction motors, or any combination thereof. A motor may also include electronic speed controllers or other components for regulating motor speed, rotation direction, and/or dynamic braking.

Still referring to FIG. 7, power source may include an energy source. An energy source may include, for example, an electrical energy source a generator, a photovoltaic device, a fuel cell such as a hydrogen fuel cell, direct methanol fuel cell, and/or solid oxide fuel cell, an electric energy storage device (e.g., a capacitor, an inductor, and/or a battery). An electrical energy source may also include a battery cell, or a plurality of battery cells connected in series into a module and each module connected in series or in parallel with other modules. Configuration of an energy source containing connected modules may be designed to meet an energy or power requirement and may be designed to fit within a designated footprint in an electric aircraft in which aircraft 700 may be incorporated.

In an embodiment, and still referring to FIG. 7, an energy source may be used to provide a steady supply of electrical power to a load over the course of a flight by a vehicle or other electric aircraft. For example, an energy source may be capable of providing sufficient power for "cruising" and other relatively low-energy phases of flight. An energy source may also be capable of providing electrical power for some higher-power phases of flight as well, particularly when the energy source is at a high SOC, as may be the case for instance during takeoff. In an embodiment, an energy source may be capable of providing sufficient electrical power for auxiliary loads including without limitation, lighting, navigation, communications, de-icing, steering or other systems requiring power or energy. Further, an energy source may be capable of providing sufficient power for controlled descent and landing protocols, including, without limitation, hovering descent or runway landing. As used herein an energy source may have high power density where electrical power an energy source can usefully produce per unit of volume and/or mass is relatively high. "Electrical power," as used in this disclosure, is defined as a rate of electrical energy per unit time. An energy source may include a device for which power that may be produced per unit of volume and/or mass has been optimized, at the expense of the maximal total specific energy density or power capacity, during design. Non-limiting examples of items that may be used as at least an energy source may include batteries used for starting applications including Li ion batteries which may include NCA, NMC, Lithium iron phosphate (LiFePO4) and Lithium Manganese Oxide (LMO) batteries, which may be mixed with another cathode chemistry to provide more specific power if the application requires Li metal batteries, which have a lithium metal anode that provides high power on demand, Li ion batteries that have a silicon or titanite anode, energy source may be used, in an embodiment, to provide electrical power to an electric aircraft or drone, such as an electric aircraft vehicle, during moments requiring high rates of power output, including without limitation takeoff, landing, thermal de-icing and situations requiring greater power output for reasons of stability, such as high turbulence situations, as described in further detail below. A battery may include, without limitation a battery using nickel based chemistries such as nickel cadmium or nickel metal hydride, a battery using lithium ion battery chemistries such as a nickel cobalt aluminum (NCA), nickel manganese cobalt (NMC), lithium iron phosphate (LiFePO4), lithium cobalt oxide (LCO), and/or lithium manganese oxide (LMO), a battery using lithium polymer technology, lead-based batteries such as without limitation lead acid batteries, metal-air batteries, or any other suitable battery. Persons skilled in the art, upon reviewing the entirety of this disclosure, will be aware of various devices of components that may be used as an energy source.

Still referring to FIG. 7, an energy source may include a plurality of energy sources, referred to herein as a module of energy sources. A module may include batteries connected in parallel or in series or a plurality of modules connected either in series or in parallel designed to deliver both the power and energy requirements of the application. Connecting batteries in series may increase the voltage of at least an energy source which may provide more power on demand. High voltage batteries may require cell matching when high peak load is needed. As more cells are connected in strings, there may exist the possibility of one cell failing which may increase resistance in the module and reduce an overall power output as a voltage of the module may decrease as a result of that failing cell. Connecting batteries in parallel may increase total current capacity by decreasing total resistance, and it also may increase overall amp-hour capacity. Overall energy and power outputs of at least an energy source may be based on individual battery cell performance or an extrapolation based on measurement of at least an electrical parameter. In an embodiment where an energy source includes a plurality of battery cells, overall power output capacity may be dependent on electrical parameters of each individual cell. If one cell experiences high self-discharge during demand, power drawn from at least an energy source may be decreased to avoid damage to the weakest cell. An energy source may further include, without limitation, wiring, conduit, housing, cooling system and battery management system. Persons skilled in the art will be aware, after reviewing the entirety of this disclosure, of many different components of an energy source.

In an embodiment and still referring to FIG. 7, plurality of flight components 708 may be arranged in a quad copter orientation. As used in this disclosure a "quad copter orientation" is at least a lift propulsor component oriented in a geometric shape and/or pattern, wherein each of the lift propulsor components are located along a vertex of the geometric shape. For example, and without limitation, a square quad copter orientation may have four lift propulsor components oriented in the geometric shape of a square, wherein each of the four lift propulsor components are located along the four vertices of the square shape. As a further non-limiting example, a hexagonal quad copter orientation may have six lift propulsor components oriented in the geometric shape of a hexagon, wherein each of the six lift propulsor components are located along the six vertices of the hexagon shape. In an embodiment, and without limitation, quad copter orientation may include a first set of lift propulsor components and a second set of lift propulsor components, wherein the first set of lift propulsor components and the second set of lift propulsor components may include two lift propulsor components each, wherein the first set of lift propulsor components and a second set of lift propulsor components are distinct from one another. For example, and without limitation, the first set of lift propulsor components may include two lift propulsor components that rotate in a clockwise direction, wherein the second set of lift propulsor components may include two lift propulsor components that rotate in a counterclockwise direction. In an embodiment, and without limitation, the first set of propulsor lift components may be oriented along a line oriented 75° from the longitudinal axis of aircraft 700. In another embodiment, and without limitation, the second set of propulsor lift components may be oriented along a line oriented 135° from the longitudinal axis, wherein the first set of lift propulsor components line and the second set of lift propulsor components are perpendicular to each other.

Still referring to FIG. 7, plurality of flight components 708 may include a pusher component 716. As used in this disclosure a "pusher component" is a component that pushes and/or thrusts an aircraft through a medium. As a non-limiting example, pusher component 716 may include a pusher propeller, a paddle wheel, a pusher motor, a pusher propulsor, and the like. Additionally, or alternatively, pusher flight component may include a plurality of pusher flight components. Pusher component 716 is configured to produce a forward thrust. As used in this disclosure a "forward thrust" is a thrust that forces aircraft through a medium in a horizontal direction, wherein a horizontal direction is a direction parallel to the longitudinal axis. As a non-limiting example, forward thrust may include a force of 1145 N to force aircraft to in a horizontal direction along the longitudinal axis. As a further non-limiting example, forward thrust may include a force of, as a non-limiting example, 300 N to force aircraft 700 in a horizontal direction along a longitudinal axis. As a further non-limiting example, pusher component 716 may twist and/or rotate to pull air behind it and, at the same time, push aircraft 700 forward with an equal amount of force. In an embodiment, and without limitation, the more air forced behind aircraft, the greater the thrust force with which the aircraft is pushed horizontally will be. In another embodiment, and without limitation, forward thrust may force aircraft 700 through the medium of relative air. Additionally or alternatively, plurality of flight components 708 may include one or more puller components. As used in this disclosure a "puller component" is a component that pulls and/or tows an aircraft through a medium. As a non-limiting example, puller component may include a flight component such as a puller propeller, a puller motor, a tractor propeller, a puller propulsor, and the like. Additionally, or alternatively, puller component may include a plurality of puller flight components.

In an embodiment and still referring to FIG. 7, aircraft 700 may include a flight controller located within fuselage 704, wherein a flight controller is described in detail below, in reference to FIG. 7. In an embodiment, and without limitation, flight controller may be configured to operate a fixed-wing flight capability. As used in this disclosure a "fixed-wing flight capability" is a method of flight wherein the plurality of laterally extending elements generate lift. For example, and without limitation, fixed-wing flight capability may generate lift as a function of an airspeed of aircraft 70 and one or more airfoil shapes of the laterally extending elements, wherein an airfoil is described above in detail. As a further non-limiting example, flight controller may operate the fixed-wing flight capability as a function of reducing applied torque on lift propulsor component 712. For example, and without limitation, flight controller may reduce a torque of 19 Nm applied to a first set of lift propulsor components to a torque of 16 Nm. As a further non-limiting example, flight controller may reduce a torque of 12 Nm applied to a first set of lift propulsor components to a torque of 0 Nm. In an embodiment, and without limitation, flight controller may produce fixed-wing flight capability as a function of increasing forward thrust exerted by pusher component 716. For example, and without limitation, flight controller may increase a forward thrust of 700 kN produced by pusher component 716 to a forward thrust of 1669 kN. In an embodiment, and without limitation, an amount of lift generation may be related to an amount of forward thrust generated to increase airspeed velocity, wherein the amount of lift generation may be directly proportional to the amount of forward thrust produced. Additionally or alternatively, flight controller may include an inertia compensator. As used in this disclosure an "inertia compensator" is one or more computing devices, electrical components, logic circuits, processors, and the like there of that are configured to compensate for inertia in one or more lift propulsor components present in aircraft 700. Inertia compensator may alternatively or additionally include any computing device used as an inertia compensator as described in U.S. Nonprovisional application Ser. No. 17/106,557, and entitled "SYSTEM AND METHOD FOR FLIGHT CONTROL IN ELECTRIC AIRCRAFT," the entirety of which is incorporated herein by reference.

In an embodiment, and still referring to FIG. 7, flight controller may be configured to perform a reverse thrust command. As used in this disclosure a "reverse thrust command" is a command to perform a thrust that forces a medium towards the relative air opposing aircraft 190. For example, reverse thrust command may include a thrust of 180 N directed towards the nose of aircraft to at least repel and/or oppose the relative air. Reverse thrust command may alternatively or additionally include any reverse thrust command as described in U.S. Nonprovisional application Ser. No. 17/319,155 and entitled "AIRCRAFT HAVING REVERSE THRUST CAPABILITIES," the entirety of which is incorporated herein by reference. In another embodiment, flight controller may be configured to perform a regenerative drag operation. As used in this disclosure a "regenerative drag operation" is an operating condition of an aircraft, wherein the aircraft has a negative thrust and/or is reducing in airspeed velocity. For example, and without limitation, regenerative drag operation may include a positive propeller speed and a negative propeller thrust. Regenerative drag operation may alternatively or additionally include any regenerative drag operation as described in U.S. Nonprovisional application Ser. No. 17/319,155.

In an embodiment, and still referring to FIG. 7, flight controller may be configured to perform a corrective action as a function of a failure event. As used in this disclosure a "corrective action" is an action conducted by the plurality of flight components to correct and/or alter a movement of an aircraft. For example, and without limitation, a corrective action may include an action to reduce a yaw torque generated by a failure event. Additionally or alternatively, corrective action may include any corrective action as described in U.S. Nonprovisional application Ser. No. 17/222,539, and entitled "AIRCRAFT FOR SELF-NEUTRALIZING FLIGHT," the entirety of which is incorporated herein by reference. As used in this disclosure a "failure event" is a failure of a lift propulsor component of the plurality of lift propulsor components. For example, and without limitation, a failure event may denote a rotation degradation of a rotor, a reduced torque of a rotor, and the like thereof.

Figure 8:
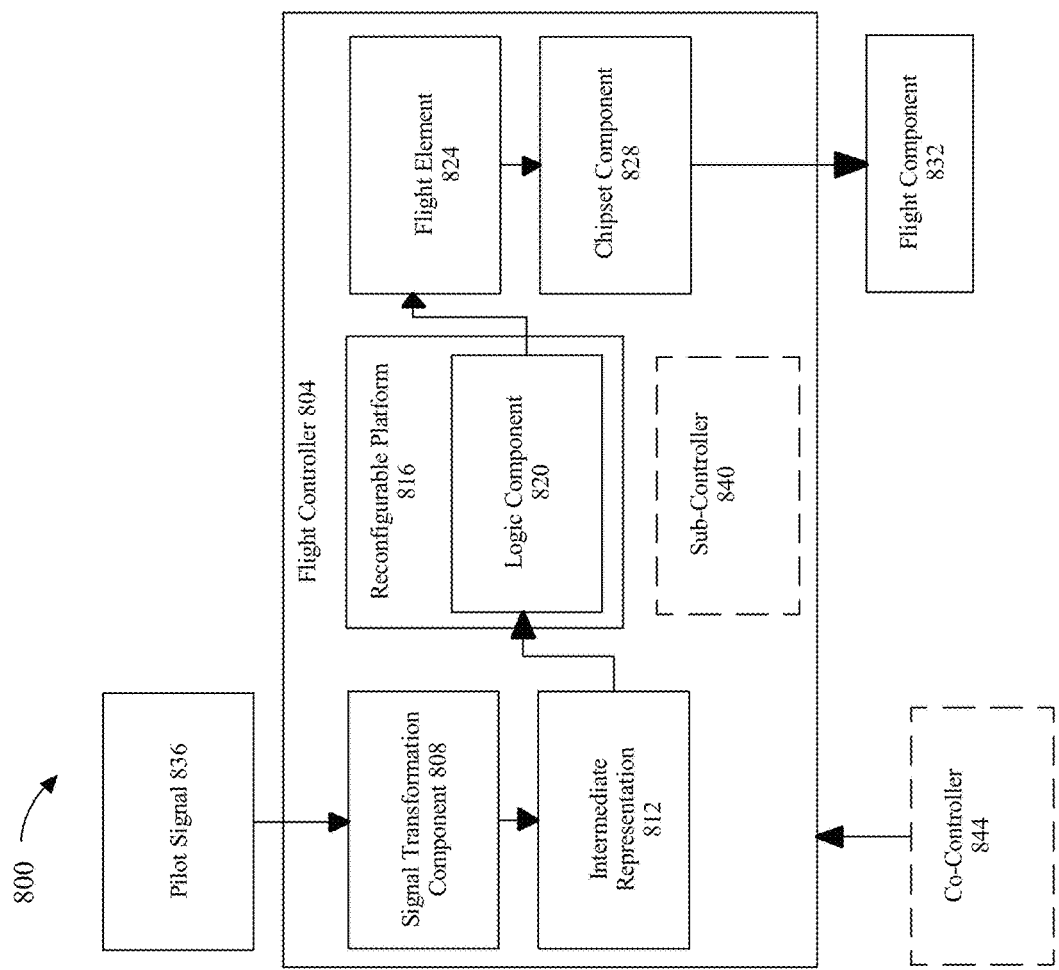
FIG. 8 is a block diagram of an exemplary flight controller.

Now referring to FIG. 8, an exemplary embodiment 800 of a flight controller 804 is illustrated. As used in this disclosure a "flight controller" is a computing device of a plurality of computing devices dedicated to data storage, security, distribution of traffic for load balancing, and flight instruction. Flight controller 804 may include and/or communicate with any computing device as described in this disclosure, including without limitation a microcontroller, microprocessor, digital signal processor (DSP) and/or system on a chip (SoC) as described in this disclosure. Further, flight controller 804 may include a single computing device operating independently, or may include two or more computing device operating in concert, in parallel, sequentially or the like; two or more computing devices may be included together in a single computing device or in two or more computing devices. In embodiments, flight controller 804 may be installed in an aircraft, may control the aircraft remotely, and/or may include an element installed in the aircraft and a remote element in communication therewith.

In an embodiment, and still referring to FIG. 8, flight controller 804 may include a signal transformation component 808. As used in this disclosure a "signal transformation component" is a component that transforms and/or converts a first signal to a second signal, wherein a signal may include one or more digital and/or analog signals. For example, and without limitation, signal transformation component 808 may be configured to perform one or more operations such as preprocessing, lexical analysis, parsing, semantic analysis, and the like thereof. In an embodiment, and without limitation, signal transformation component 808 may include one or more analog-to-digital convertors that transform a first signal of an analog signal to a second signal of a digital signal. For example, and without limitation, an analog-to-digital converter may convert an analog input signal to an 8-bit binary digital representation of that signal. In another embodiment, signal transformation component 808 may include transforming one or more low-level languages such as, but not limited to, machine languages and/or assembly languages. For example, and without limitation, signal transformation component 808 may include transforming a binary language signal to an assembly language signal. In an embodiment, and without limitation, signal transformation component 808 may include transforming one or more high-level languages and/or formal languages such as but not limited to alphabets, strings, and/or languages. For example, and without limitation, high-level languages may include one or more system languages, scripting languages, domain-specific languages, visual languages, esoteric languages, and the like thereof. As a further non-limiting example, high-level languages may include one or more algebraic formula languages, business data languages, string and list languages, object-oriented languages, and the like thereof.

Still referring to FIG. 8, signal transformation component 808 may be configured to optimize an intermediate representation 812. As used in this disclosure an "intermediate representation" is a data structure and/or code that represents the input signal. Signal transformation component 808 may optimize intermediate representation as a function of a data-flow analysis, dependence analysis, alias analysis, pointer analysis, escape analysis, and the like thereof. In an embodiment, and without limitation, signal transformation component 808 may optimize intermediate representation 812 as a function of one or more inline expansions, dead code eliminations, constant propagation, loop transformations, and/or automatic parallelization functions. In another embodiment, signal transformation component 808 may optimize intermediate representation as a function of a machine dependent optimization such as a peephole optimization, wherein a peephole optimization may rewrite short sequences of code into more efficient sequences of code. Signal transformation component 808 may optimize intermediate representation to generate an output language, wherein an "output language," as used herein, is the native machine language of flight controller 804. For example, and without limitation, native machine language may include one or more binary and/or numerical languages.

In an embodiment, and without limitation, signal transformation component 808 may include transform one or more inputs and outputs as a function of an error correction code. An error correction code, also known as error correcting code (ECC), is an encoding of a message or lot of data using redundant information, permitting recovery of corrupted data. An ECC may include a block code, in which information is encoded on fixed-size packets and/or blocks of data elements such as symbols of predetermined size, bits, or the like. Reed-Solomon coding, in which message symbols within a symbol set having q symbols are encoded as coefficients of a polynomial of degree less than or equal to a natural number k, over a finite field F with q elements; strings so encoded have a minimum hamming distance of k+1, and permit correction of (q−k−1)/2 erroneous symbols. Block code may alternatively or additionally be implemented using Golay coding, also known as binary Golay coding, Bose-Chaudhuri, Hocquenghuem (BCH) coding, multidimensional parity-check coding, and/or Hamming codes. An ECC may alternatively or additionally be based on a convolutional code.

In an embodiment, and still referring to FIG. 8, flight controller 804 may include a reconfigurable hardware platform 816. A "reconfigurable hardware platform," as used herein, is a component and/or unit of hardware that may be reprogrammed, such that, for instance, a data path between elements such as logic gates or other digital circuit elements may be modified to change an algorithm, state, logical sequence, or the like of the component and/or unit. This may be accomplished with such flexible high-speed computing fabrics as field-programmable gate arrays (FPGAs), which may include a grid of interconnected logic gates, connections between which may be severed and/or restored to program in modified logic. Reconfigurable hardware platform 816 may be reconfigured to enact any algorithm and/or algorithm selection process received from another computing device and/or created using machine-learning processes.

Still referring to FIG. 8, reconfigurable hardware platform 816 may include a logic component 520. As used in this disclosure a "logic component" is a component that executes instructions on output language. For example, and without limitation, logic component may perform basic arithmetic, logic, controlling, input/output operations, and the like thereof. Logic component 520 may include any suitable processor, such as without limitation a component incorporating logical circuitry for performing arithmetic and logical operations, such as an arithmetic and logic unit (ALU), which may be regulated with a state machine and directed by operational inputs from memory and/or sensors; logic component 520 may be organized according to Von Neumann and/or Harvard architecture as a non-limiting example. Logic component 520 may include, incorporate, and/or be incorporated in, without limitation, a microcontroller, microprocessor, digital signal processor (DSP), Field Programmable Gate Array (FPGA), Complex Programmable Logic Device (CPLD), Graphical Processing Unit (GPU), general purpose GPU, Tensor Processing Unit (TPU), analog or mixed signal processor, Trusted Platform Module (TPM), a floating-point unit (FPU), and/or system on a chip (SoC). In an embodiment, logic component 520 may include one or more integrated circuit microprocessors, which may contain one or more central processing units, central processors, and/or main processors, on a single metal-oxide-semiconductor chip. Logic component 520 may be configured to execute a sequence of stored instructions to be performed on the output language and/or intermediate representation 812. Logic component 520 may be configured to fetch and/or retrieve the instruction from a memory cache, wherein a "memory cache," as used in this disclosure, is a stored instruction set on flight controller 804. Logic component 520 may be configured to decode the instruction retrieved from the memory cache to opcodes and/or operands. Logic component 520 may be configured to execute the instruction on intermediate representation 812 and/or output language. For example, and without limitation, logic component 520 may be configured to execute an addition operation on intermediate representation 812 and/or output language.

In an embodiment, and without limitation, logic component 520 may be configured to calculate a flight element 524. As used in this disclosure a "flight element" is an element of datum denoting a relative status of aircraft. For example, and without limitation, flight element 524 may denote one or more torques, thrusts, airspeed velocities, forces, altitudes, groundspeed velocities, directions during flight, directions facing, forces, orientations, and the like thereof. For example, and without limitation, flight element 524 may denote that aircraft is cruising at an altitude and/or with a sufficient magnitude of forward thrust. As a further non-limiting example, flight status may denote that is building thrust and/or groundspeed velocity in preparation for a takeoff. As a further non-limiting example, flight element 524 may denote that aircraft is following a flight path accurately and/or sufficiently.

Still referring to FIG. 8, flight controller 804 may include a chipset component 528. As used in this disclosure a "chipset component" is a component that manages data flow. In an embodiment, and without limitation, chipset component 528 may include a northbridge data flow path, wherein the northbridge dataflow path may manage data flow from logic component 520 to a high-speed device and/or component, such as a RAM, graphics controller, and the like thereof. In another embodiment, and without limitation, chipset component 528 may include a southbridge data flow path, wherein the southbridge dataflow path may manage data flow from logic component 520 to lower-speed peripheral buses, such as a peripheral component interconnect (PCI), industry standard architecture (ICA), and the like thereof. In an embodiment, and without limitation, southbridge data flow path may include managing data flow between peripheral connections such as ethernet, USB, audio devices, and the like thereof. Additionally or alternatively, chipset component 528 may manage data flow between logic component 520, memory cache, and a flight component 532. As used in this disclosure a "flight component" is a portion of an aircraft that can be moved or adjusted to affect one or more flight elements. For example, flight component 532 may include a component used to affect the aircrafts' roll and pitch which may comprise one or more ailerons. As a further example, flight component 532 may include a rudder to control yaw of an aircraft. In an embodiment, chipset component 528 may be configured to communicate with a plurality of flight components as a function of flight element 524. For example, and without limitation, chipset component 528 may transmit to an aircraft rotor to reduce torque of a first lift propulsor and increase the forward thrust produced by a pusher component to perform a flight maneuver.

In an embodiment, and still referring to FIG. 8, flight controller 804 may be configured generate an autonomous function. As used in this disclosure an "autonomous function" is a mode and/or function of flight controller 804 that controls aircraft automatically. For example, and without limitation, autonomous function may perform one or more aircraft maneuvers, take offs, landings, altitude adjustments, flight leveling adjustments, turns, climbs, and/or descents. As a further non-limiting example, autonomous function may adjust one or more airspeed velocities, thrusts, torques, and/or groundspeed velocities. As a further non-limiting example, autonomous function may perform one or more flight path corrections and/or flight path modifications as a function of flight element 524. In an embodiment, autonomous function may include one or more modes of autonomy such as, but not limited to, autonomous mode, semi-autonomous mode, and/or non-autonomous mode. As used in this disclosure "autonomous mode" is a mode that automatically adjusts and/or controls aircraft and/or the maneuvers of aircraft in its entirety. For example, autonomous mode may denote that flight controller 804 will adjust the aircraft. As used in this disclosure a "semi-autonomous mode" is a mode that automatically adjusts and/or controls a portion and/or section of aircraft. For example, and without limitation, semi-autonomous mode may denote that a pilot will control the propulsors, wherein flight controller 804 will control the ailerons and/or rudders. As used in this disclosure "non-autonomous mode" is a mode that denotes a pilot will control aircraft and/or maneuvers of aircraft in its entirety.

In an embodiment, and still referring to FIG. 8, flight controller 804 may generate autonomous function as a function of an autonomous machine-learning model. As used in this disclosure an "autonomous machine-learning model" is a machine-learning model to produce an autonomous function output given flight element 524 and a pilot signal 536 as inputs; this is in contrast to a non-machine learning software program where the commands to be executed are determined in advance by a user and written in a programming language. As used in this disclosure a "pilot signal" is an element of datum representing one or more functions a pilot is controlling and/or adjusting. For example, pilot signal 536 may denote that a pilot is controlling and/or maneuvering ailerons, wherein the pilot is not in control of the rudders and/or propulsors. In an embodiment, pilot signal 536 may include an implicit signal and/or an explicit signal. For example, and without limitation, pilot signal 536 may include an explicit signal, wherein the pilot explicitly states there is a lack of control and/or desire for autonomous function. As a further non-limiting example, pilot signal 536 may include an explicit signal directing flight controller 804 to control and/or maintain a portion of aircraft, a portion of the flight plan, the entire aircraft, and/or the entire flight plan. As a further non-limiting example, pilot signal 536 may include an implicit signal, wherein flight controller 804 detects a lack of control such as by a malfunction, torque alteration, flight path deviation, and the like thereof. In an embodiment, and without limitation, pilot signal 536 may include one or more explicit signals to reduce torque, and/or one or more implicit signals that torque may be reduced due to reduction of airspeed velocity. In an embodiment, and without limitation, pilot signal 536 may include one or more local and/or global signals. For example, and without limitation, pilot signal 536 may include a local signal that is transmitted by a pilot and/or crew member. As a further non-limiting example, pilot signal 536 may include a global signal that is transmitted by air traffic control and/or one or more remote users that are in communication with the pilot of aircraft. In an embodiment, pilot signal 536 may be received as a function of a tri-state bus and/or multiplexor that denotes an explicit pilot signal should be transmitted prior to any implicit or global pilot signal.

Still referring to FIG. 8, autonomous machine-learning model may include one or more autonomous machine-learning processes such as supervised, unsupervised, or reinforcement machine-learning processes that flight controller 804 and/or a remote device may or may not use in the generation of autonomous function. As used in this disclosure "remote device" is an external device to flight controller 804. Additionally or alternatively, autonomous machine-learning model may include one or more autonomous machine-learning processes that a field-programmable gate array (FPGA) may or may not use in the generation of autonomous function. Autonomous machine-learning process may include, without limitation machine learning processes such as simple linear regression, multiple linear regression, polynomial regression, support vector regression, ridge regression, lasso regression, elasticnet regression, decision tree regression, random forest regression, logistic regression, logistic classification, K-nearest neighbors, support vector machines, kernel support vector machines, naïve bayes, decision tree classification, random forest classification, K-means clustering, hierarchical clustering, dimensionality reduction, principal component analysis, linear discriminant analysis, kernel principal component analysis, Q-learning, State Action Reward State Action (SARSA), Deep-Q network, Markov decision processes, Deep Deterministic Policy Gradient (DDPG), or the like thereof.

In an embodiment, and still referring to FIG. 8, autonomous machine learning model may be trained as a function of autonomous training data, wherein autonomous training data may correlate a flight element, pilot signal, and/or simulation data to an autonomous function. For example, and without limitation, a flight element of an airspeed velocity, a pilot signal of limited and/or no control of propulsors, and a simulation data of required airspeed velocity to reach the destination may result in an autonomous function that includes a semi-autonomous mode to increase thrust of the propulsors. Autonomous training data may be received as a function of user-entered valuations of flight elements, pilot signals, simulation data, and/or autonomous functions. Flight controller 804 may receive autonomous training data by receiving correlations of flight element, pilot signal, and/or simulation data to an autonomous function that were previously received and/or determined during a previous iteration of generation of autonomous function. Autonomous training data may be received by one or more remote devices and/or FPGAs that at least correlate a flight element, pilot signal, and/or simulation data to an autonomous function. Autonomous training data may be received in the form of one or more user-entered correlations of a flight element, pilot signal, and/or simulation data to an autonomous function.

Still referring to FIG. 8, flight controller 804 may receive autonomous machine-learning model from a remote device and/or FPGA that utilizes one or more autonomous machine learning processes, wherein a remote device and an FPGA is described above in detail. For example, and without limitation, a remote device may include a computing device, external device, processor, FPGA, microprocessor and the like thereof. Remote device and/or FPGA may perform the autonomous machine-learning process using autonomous training data to generate autonomous function and transmit the output to flight controller 804. Remote device and/or FPGA may transmit a signal, bit, datum, or parameter to flight controller 804 that at least relates to autonomous function. Additionally or alternatively, the remote device and/or FPGA may provide an updated machine-learning model. For example, and without limitation, an updated machine-learning model may be comprised of a firmware update, a software update, an autonomous machine-learning process correction, and the like thereof. As a non-limiting example a software update may incorporate a new simulation data that relates to a modified flight element. Additionally or alternatively, the updated machine learning model may be transmitted to the remote device and/or FPGA, wherein the remote device and/or FPGA may replace the autonomous machine-learning model with the updated machine-learning model and generate the autonomous function as a function of the flight element, pilot signal, and/or simulation data using the updated machine-learning model. The updated machine-learning model may be transmitted by the remote device and/or FPGA and received by flight controller 804 as a software update, firmware update, or corrected autonomous machine-learning model. For example, and without limitation autonomous machine learning model may utilize a neural net machine-learning process, wherein the updated machine-learning model may incorporate a gradient boosting machine-learning process.

Still referring to FIG. 8, flight controller 804 may include, be included in, and/or communicate with a mobile device such as a mobile telephone or smartphone. Further, flight controller may communicate with one or more additional devices as described below in further detail via a network interface device. The network interface device may be utilized for commutatively connecting a flight controller to one or more of a variety of networks, and one or more devices. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. The network may include any network topology and can may employ a wired and/or a wireless mode of communication.

In an embodiment, and still referring to FIG. 8, flight controller 804 may include, but is not limited to, for example, a cluster of flight controllers in a first location and a second flight controller or cluster of flight controllers in a second location. Flight controller 804 may include one or more flight controllers dedicated to data storage, security, distribution of traffic for load balancing, and the like. Flight controller 804 may be configured to distribute one or more computing tasks as described below across a plurality of flight controllers, which may operate in parallel, in series, redundantly, or in any other manner used for distribution of tasks or memory between computing devices. For example, and without limitation, flight controller 804 may implement a control algorithm to distribute and/or command the plurality of flight controllers. As used in this disclosure a "control algorithm" is a finite sequence of well-defined computer implementable instructions that may determine the flight component of the plurality of flight components to be adjusted. For example, and without limitation, control algorithm may include one or more algorithms that reduce and/or prevent aviation asymmetry. As a further non-limiting example, control algorithms may include one or more models generated as a function of a software including, but not limited to Simulink by MathWorks, Natick, Mass., USA. In an embodiment, and without limitation, control algorithm may be configured to generate an auto-code, wherein an "auto-code," is used herein, is a code and/or algorithm that is generated as a function of the one or more models and/or software's. In another embodiment, control algorithm may be configured to produce a segmented control algorithm. As used in this disclosure a "segmented control algorithm" is control algorithm that has been separated and/or parsed into discrete sections. For example, and without limitation, segmented control algorithm may parse control algorithm into two or more segments, wherein each segment of control algorithm may be performed by one or more flight controllers operating on distinct flight components.

In an embodiment, and still referring to FIG. 8, control algorithm may be configured to determine a segmentation boundary as a function of segmented control algorithm. As used in this disclosure a "segmentation boundary" is a limit and/or delineation associated with the segments of the segmented control algorithm. For example, and without limitation, segmentation boundary may denote that a segment in the control algorithm has a first starting section and/or a first ending section. As a further non-limiting example, segmentation boundary may include one or more boundaries associated with an ability of flight component 532. In an embodiment, control algorithm may be configured to create an optimized signal communication as a function of segmentation boundary. For example, and without limitation, optimized signal communication may include identifying the discrete timing required to transmit and/or receive the one or more segmentation boundaries. In an embodiment, and without limitation, creating optimized signal communication further comprises separating a plurality of signal codes across the plurality of flight controllers. For example, and without limitation the plurality of flight controllers may include one or more formal networks, wherein formal networks transmit data along an authority chain and/or are limited to task-related communications. As a further non-limiting example, communication network may include informal networks, wherein informal networks transmit data in any direction. In an embodiment, and without limitation, the plurality of flight controllers may include a chain path, wherein a "chain path," as used herein, is a linear communication path comprising a hierarchy that data may flow through. In an embodiment, and without limitation, the plurality of flight controllers may include an all-channel path, wherein an "all-channel path," as used herein, is a communication path that is not restricted to a particular direction. For example, and without limitation, data may be transmitted upward, downward, laterally, and the like thereof. In an embodiment, and without limitation, the plurality of flight controllers may include one or more neural networks that assign a weighted value to a transmitted datum. For example, and without limitation, a weighted value may be assigned as a function of one or more signals denoting that a flight component is malfunctioning and/or in a failure state.

Still referring to FIG. 8, the plurality of flight controllers may include a master bus controller. As used in this disclosure a "master bus controller" is one or more devices and/or components that are connected to a bus to initiate a direct memory access transaction, wherein a bus is one or more terminals in a bus architecture. Master bus controller may communicate using synchronous and/or asynchronous bus control protocols. In an embodiment, master bus controller may include flight controller 804. In another embodiment, master bus controller may include one or more universal asynchronous receiver-transmitters (UART). For example, and without limitation, master bus controller may include one or more bus architectures that allow a bus to initiate a direct memory access transaction from one or more buses in the bus architectures. As a further non-limiting example, master bus controller may include one or more peripheral devices and/or components to communicate with another peripheral device and/or component and/or the master bus controller. In an embodiment, master bus controller may be configured to perform bus arbitration. As used in this disclosure "bus arbitration" is method and/or scheme to prevent multiple buses from attempting to communicate with and/or connect to master bus controller. For example and without limitation, bus arbitration may include one or more schemes such as a small computer interface system, wherein a small computer interface system is a set of standards for physical connecting and transferring data between peripheral devices and master bus controller by defining commands, protocols, electrical, optical, and/or logical interfaces. In an embodiment, master bus controller may receive intermediate representation 812 and/or output language from logic component 520, wherein output language may include one or more analog-to-digital conversions, low bit rate transmissions, message encryptions, digital signals, binary signals, logic signals, analog signals, and the like thereof described above in detail.

Still referring to FIG. 8, master bus controller may communicate with a slave bus. As used in this disclosure a "slave bus" is one or more peripheral devices and/or components that initiate a bus transfer. For example, and without limitation, slave bus may receive one or more controls and/or asymmetric communications from master bus controller, wherein slave bus transfers data stored to master bus controller. In an embodiment, and without limitation, slave bus may include one or more internal buses, such as but not limited to a/an internal data bus, memory bus, system bus, front-side bus, and the like thereof. In another embodiment, and without limitation, slave bus may include one or more external buses such as external flight controllers, external computers, remote devices, printers, aircraft computer systems, flight control systems, and the like thereof.

In an embodiment, and still referring to FIG. 8, control algorithm may optimize signal communication as a function of determining one or more discrete timings. For example, and without limitation master bus controller may synchronize timing of the segmented control algorithm by injecting high priority timing signals on a bus of the master bus control. As used in this disclosure a "high priority timing signal" is information denoting that the information is important. For example, and without limitation, high priority timing signal may denote that a section of control algorithm is of high priority and should be analyzed and/or transmitted prior to any other sections being analyzed and/or transmitted. In an embodiment, high priority timing signal may include one or more priority packets. As used in this disclosure a "priority packet" is a formatted unit of data that is communicated between the plurality of flight controllers. For example, and without limitation, priority packet may denote that a section of control algorithm should be used and/or is of greater priority than other sections.

Still referring to FIG. 8, flight controller 804 may also be implemented using a "shared nothing" architecture in which data is cached at the worker, in an embodiment, this may enable scalability of aircraft and/or computing device. Flight controller 804 may include a distributer flight controller. As used in this disclosure a "distributer flight controller" is a component that adjusts and/or controls a plurality of flight components as a function of a plurality of flight controllers. For example, distributer flight controller may include a flight controller that communicates with a plurality of additional flight controllers and/or clusters of flight controllers. In an embodiment, distributed flight control may include one or more neural networks. For example, neural network also known as an artificial neural network, is a network of "nodes," or data structures having one or more inputs, one or more outputs, and a function determining outputs based on inputs. Such nodes may be organized in a network, such as without limitation a convolutional neural network, including an input layer of nodes, one or more intermediate layers, and an output layer of nodes. Connections between nodes may be created via the process of "training" the network, in which elements from a training dataset are applied to the input nodes, a suitable training algorithm (such as Levenberg-Marquardt, conjugate gradient, simulated annealing, or other algorithms) is then used to adjust the connections and weights between nodes in adjacent layers of the neural network to produce the desired values at the output nodes. This process is sometimes referred to as deep learning.

Still referring to FIG. 8, a node may include, without limitation a plurality of inputs $x_i$ that may receive numerical values from inputs to a neural network containing the node and/or from other nodes. Node may perform a weighted sum of inputs using weights $w_i$ that are multiplied by respective inputs $x_i$. Additionally or alternatively, a bias b may be added to the weighted sum of the inputs such that an offset is added to each unit in the neural network layer that is independent of the input to the layer. The weighted sum may then be input into a function $\varphi$, which may generate one or more outputs y. Weight $w_i$ applied to an input $x_i$ may indicate whether the input is "excitatory," indicating that it has strong influence on the one or more outputs y, for instance by the corresponding weight having a large numerical value, and/or a "inhibitory," indicating it has a weak effect influence on the one more inputs y, for instance by the corresponding weight having a small numerical value. The values of weights $w_i$ may be determined by training a neural network using training data, which may be performed using any suitable process as described above. In an embodiment, and without limitation, a neural network may receive semantic units as inputs and output vectors representing such semantic units according to weights $w_i$ that are derived using machine-learning processes as described in this disclosure.

Still referring to FIG. 8, flight controller may include a sub-controller 540. As used in this disclosure a "sub-controller" is a controller and/or component that is part of a distributed controller as described above; for instance, flight controller 804 may be and/or include a distributed flight controller made up of one or more sub-controllers. For example, and without limitation, sub-controller 540 may include any controllers and/or components thereof that are similar to distributed flight controller and/or flight controller as described above. Sub-controller 540 may include any component of any flight controller as described above. Sub-controller 540 may be implemented in any manner suitable for implementation of a flight controller as described above. As a further non-limiting example, sub-controller 540 may include one or more processors, logic components and/or computing devices capable of receiving, processing, and/or transmitting data across the distributed flight controller as described above. As a further non-limiting example, sub-controller 540 may include a controller that receives a signal from a first flight controller and/or first distributed flight controller component and transmits the signal to a plurality of additional sub-controllers and/or flight components.

Still referring to FIG. 8, flight controller may include a co-controller 544. As used in this disclosure a "co-controller" is a controller and/or component that joins flight controller 804 as components and/or nodes of a distributer flight controller as described above. For example, and without limitation, co-controller 544 may include one or more controllers and/or components that are similar to flight controller 804. As a further non-limiting example, co-controller 544 may include any controller and/or component that joins flight controller 804 to distributer flight controller. As a further non-limiting example, co-controller 544 may include one or more processors, logic components and/or computing devices capable of receiving, processing, and/or transmitting data to and/or from flight controller 804 to distributed flight control system. Co-controller 544 may include any component of any flight controller as described above. Co-controller 544 may be implemented in any manner suitable for implementation of a flight controller as described above. In an embodiment, and with continued reference to FIG. 8, flight controller 804 may be designed and/or configured to perform any method, method step, or sequence of method steps in any embodiment described in this disclosure, in any order and with any degree of repetition. For instance, flight controller 804 may be configured to perform a single step or sequence repeatedly until a desired or commanded outcome is achieved; repetition of a step or a sequence of steps may be performed iteratively and/or recursively using outputs of previous repetitions as inputs to subsequent repetitions, aggregating inputs and/or outputs of repetitions to produce an aggregate result, reduction or decrement of one or more variables such as global variables, and/or division of a larger processing task into a set of iteratively addressed smaller processing tasks. Flight controller may perform any step or sequence of steps as described in this disclosure in parallel, such as simultaneously and/or substantially simultaneously performing a step two or more times using two or more parallel threads, processor cores, or the like; division of tasks between parallel threads and/or processes may be performed according to any protocol suitable for division of tasks between iterations. Persons skilled in the art, upon reviewing the entirety of this disclosure, will be aware of various ways in which steps, sequences of steps, processing tasks, and/or data may be subdivided, shared, or otherwise dealt with using iteration, recursion, and/or parallel processing.

Figure 9:
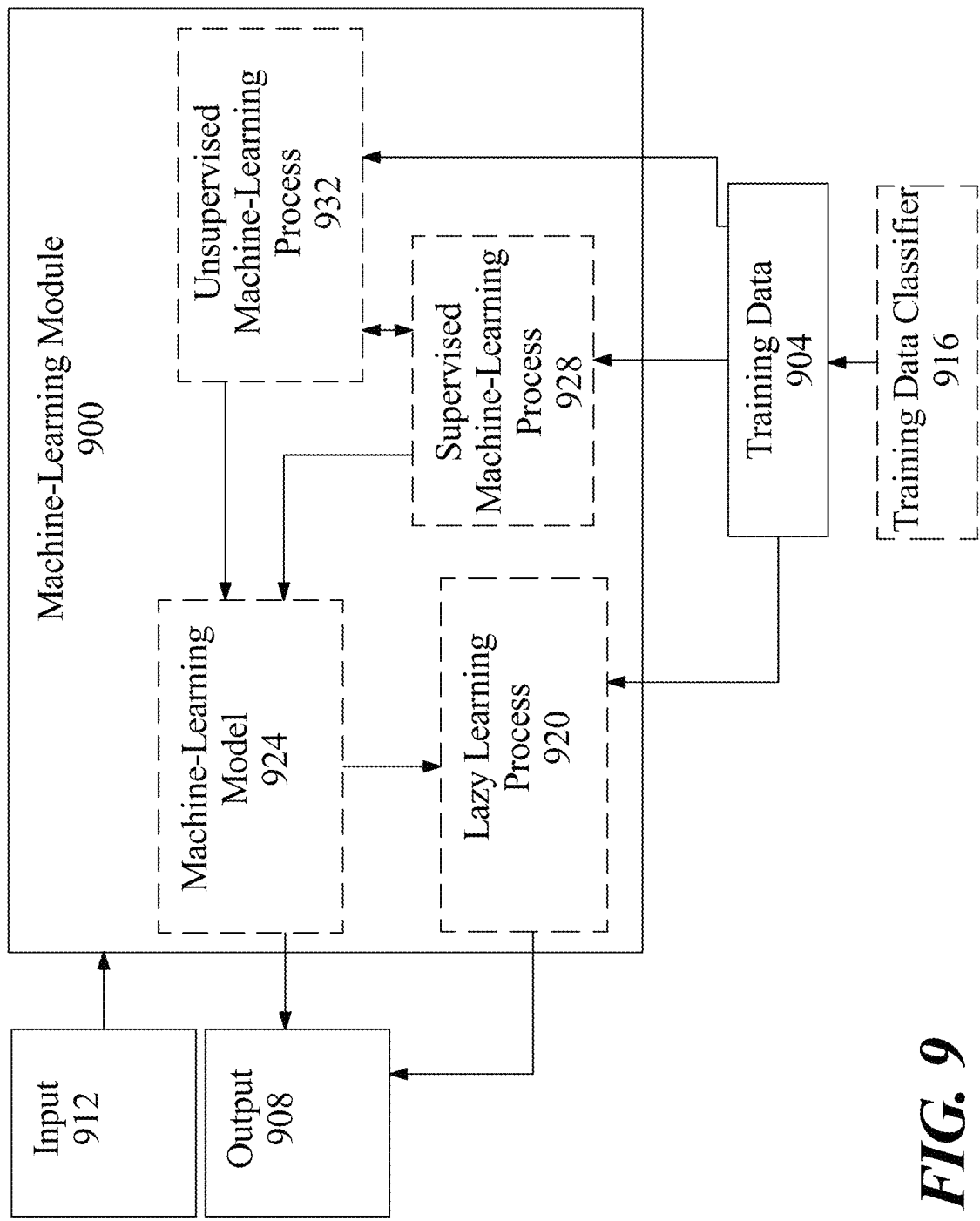
FIG. 9 is a block diagram of an exemplary machine-learning process.

Referring now to FIG. 9, an exemplary embodiment of a machine-learning module 900 that may perform one or more machine-learning processes as described in this disclosure is illustrated. Machine-learning module may perform determinations, classification, and/or analysis steps, methods, processes, or the like as described in this disclosure using machine learning processes. A "machine learning process," as used in this disclosure, is a process that automatedly uses training data 904 to generate an algorithm that will be performed by a computing device/module to produce outputs 908 given data provided as inputs 912; this is in contrast to a non-machine learning software program where the commands to be executed are determined in advance by a user and written in a programming language.

Still referring to FIG. 9, "training data," as used herein, is data containing correlations that a machine-learning process may use to model relationships between two or more categories of data elements. For instance, and without limitation, training data 904 may include a plurality of data entries, each entry representing a set of data elements that were recorded, received, and/or generated together; data elements may be correlated by shared existence in a given data entry, by proximity in a given data entry, or the like. Multiple data entries in training data 904 may evince one or more trends in correlations between categories of data elements; for instance, and without limitation, a higher value of a first data element belonging to a first category of data element may tend to correlate to a higher value of a second data element belonging to a second category of data element, indicating a possible proportional or other mathematical relationship linking values belonging to the two categories. Multiple categories of data elements may be related in training data 904 according to various correlations; correlations may indicate causative and/or predictive links between categories of data elements, which may be modeled as relationships such as mathematical relationships by machine-learning processes as described in further detail below. Training data 904 may be formatted and/or organized by categories of data elements, for instance by associating data elements with one or more descriptors corresponding to categories of data elements. As a non-limiting example, training data 904 may include data entered in standardized forms by persons or processes, such that entry of a given data element in a given field in a form may be mapped to one or more descriptors of categories. Elements in training data 904 may be linked to descriptors of categories by tags, tokens, or other data elements; for instance, and without limitation, training data 904 may be provided in fixed-length formats, formats linking positions of data to categories such as comma-separated value (CSV) formats and/or self-describing formats such as extensible markup language (XML), JavaScript Object Notation (JSON), or the like, enabling processes or devices to detect categories of data.

Alternatively or additionally, and continuing to refer to FIG. 9, training data 904 may include one or more elements that are not categorized; that is, training data 904 may not be formatted or contain descriptors for some elements of data. Machine-learning algorithms and/or other processes may sort training data 904 according to one or more categorizations using, for instance, natural language processing algorithms, tokenization, detection of correlated values in raw data and the like; categories may be generated using correlation and/or other processing algorithms. As a non-limiting example, in a corpus of text, phrases making up a number "n" of compound words, such as nouns modified by other nouns, may be identified according to a statistically significant prevalence of n-grams containing such words in a particular order; such an n-gram may be categorized as an element of language such as a "word" to be tracked similarly to single words, generating a new category as a result of statistical analysis. Similarly, in a data entry including some textual data, a person's name may be identified by reference to a list, dictionary, or other compendium of terms, permitting ad-hoc categorization by machine-learning algorithms, and/or automated association of data in the data entry with descriptors or into a given format. The ability to categorize data entries automatedly may enable the same training data 904 to be made applicable for two or more distinct machine-learning algorithms as described in further detail below. Training data 904 used by machine-learning module 900 may correlate any input data as described in this disclosure to any output data as described in this disclosure. As a non-limiting illustrative example, the battery pack datum as an input and output a battery degradation model.

Further referring to FIG. 9, training data may be filtered, sorted, and/or selected using one or more supervised and/or unsupervised machine-learning processes and/or models as described in further detail below; such models may include without limitation a training data classifier 916. Training data classifier 916 may include a "classifier," which as used in this disclosure is a machine-learning model as defined below, such as a mathematical model, neural net, or program generated by a machine learning algorithm known as a "classification algorithm," as described in further detail below, that sorts inputs into categories or bins of data, outputting the categories or bins of data and/or labels associated therewith. A classifier may be configured to output at least a datum that labels or otherwise identifies a set of data that are clustered together, found to be close under a distance metric as described below, or the like. Machine-learning module 900 may generate a classifier using a classification algorithm, defined as a processes whereby a computing device and/or any module and/or component operating thereon derives a classifier from training data 904. Classification may be performed using, without limitation, linear classifiers such as without limitation logistic regression and/or naive Bayes classifiers, nearest neighbor classifiers such as k-nearest neighbors classifiers, support vector machines, least squares support vector machines, fisher's linear discriminant, quadratic classifiers, decision trees, boosted trees, random forest classifiers, learning vector quantization, and/or neural network-based classifiers. As a non-limiting example, training data classifier 916 may classify elements of training data to different prediction models of battery degradation for which a subset of training data may be selected.

Still referring to FIG. 9, machine-learning module 900 may be configured to perform a lazy-learning process 920 and/or protocol, which may alternatively be referred to as a "lazy loading" or "call-when-needed" process and/or protocol, may be a process whereby machine learning is conducted upon receipt of an input to be converted to an output, by combining the input and training set to derive the algorithm to be used to produce the output on demand. For instance, an initial set of simulations may be performed to cover an initial heuristic and/or "first guess" at an output and/or relationship. As a non-limiting example, an initial heuristic may include a ranking of associations between inputs and elements of training data 904. Heuristic may include selecting some number of highest-ranking associations and/or training data 904 elements. Lazy learning may implement any suitable lazy learning algorithm, including without limitation a K-nearest neighbors algorithm, a lazy naïve Bayes algorithm, or the like; persons skilled in the art, upon reviewing the entirety of this disclosure, will be aware of various lazy-learning algorithms that may be applied to generate outputs as described in this disclosure, including without limitation lazy learning applications of machine-learning algorithms as described in further detail below.

Alternatively or additionally, and with continued reference to FIG. 9, machine-learning processes as described in this disclosure may be used to generate machine-learning models 924. A "machine-learning model," as used in this disclosure, is a mathematical and/or algorithmic representation of a relationship between inputs and outputs, as generated using any machine-learning process including without limitation any process as described above, and stored in memory; an input is submitted to a machine-learning model 924 once created, which generates an output based on the relationship that was derived. For instance, and without limitation, a linear regression model, generated using a linear regression algorithm, may compute a linear combination of input data using coefficients derived during machine-learning processes to calculate an output datum. As a further non-limiting example, a machine-learning model 924 may be generated by creating an artificial neural network, such as a convolutional neural network comprising an input layer of nodes, one or more intermediate layers, and an output layer of nodes. Connections between nodes may be created via the process of "training" the network, in which elements from a training data 904 set are applied to the input nodes, a suitable training algorithm (such as Levenberg-Marquardt, conjugate gradient, simulated annealing, or other algorithms) is then used to adjust the connections and weights between nodes in adjacent layers of the neural network to produce the desired values at the output nodes. This process is sometimes referred to as deep learning.

Still referring to FIG. 9, machine-learning algorithms may include at least a supervised machine-learning process 928. At least a supervised machine-learning process 928, as defined herein, include algorithms that receive a training set relating a number of inputs to a number of outputs, and seek to find one or more mathematical relations relating inputs to outputs, where each of the one or more mathematical relations is optimal according to some criterion specified to the algorithm using some scoring function. For instance, a supervised learning algorithm may include any battery pack datum which may be retrieved from the battery database as described above as inputs, any battery pack model or battery degradation model from the battery database as outputs, and a scoring function representing a desired form of relationship to be detected between inputs and outputs; scoring function may, for instance, seek to maximize the probability that a given input and/or combination of elements inputs is associated with a given output to minimize the probability that a given input is not associated with a given output. Scoring function may be expressed as a risk function representing an "expected loss" of an algorithm relating inputs to outputs, where loss is computed as an error function representing a degree to which a prediction generated by the relation is incorrect when compared to a given input-output pair provided in training data 904. Persons skilled in the art, upon reviewing the entirety of this disclosure, will be aware of various possible variations of at least a supervised machine-learning process 928 that may be used to determine relation between inputs and outputs. Supervised machine-learning processes may include classification algorithms as defined above.

Further referring to FIG. 9, machine learning processes may include at least an unsupervised machine-learning processes 932. An unsupervised machine-learning process, as used herein, is a process that derives inferences in datasets without regard to labels; as a result, an unsupervised machine-learning process may be free to discover any structure, relationship, and/or correlation provided in the data. Unsupervised processes may not require a response variable; unsupervised processes may be used to find interesting patterns and/or inferences between variables, to determine a degree of correlation between two or more variables, or the like.

Still referring to FIG. 9, machine-learning module 900 may be designed and configured to create a machine-learning model 924 using techniques for development of linear regression models. Linear regression models may include ordinary least squares regression, which aims to minimize the square of the difference between predicted outcomes and actual outcomes according to an appropriate norm for measuring such a difference (e.g. a vector-space distance norm); coefficients of the resulting linear equation may be modified to improve minimization. Linear regression models may include ridge regression methods, where the function to be minimized includes the least-squares function plus term multiplying the square of each coefficient by a scalar amount to penalize large coefficients. Linear regression models may include least absolute shrinkage and selection operator (LASSO) models, in which ridge regression is combined with multiplying the least-squares term by a factor of 1 divided by double the number of samples. Linear regression models may include a multi-task lasso model wherein the norm applied in the least-squares term of the lasso model is the Frobenius norm amounting to the square root of the sum of squares of all terms. Linear regression models may include the elastic net model, a multi-task elastic net model, a least angle regression model, a LARS lasso model, an orthogonal matching pursuit model, a Bayesian regression model, a logistic regression model, a stochastic gradient descent model, a perceptron model, a passive aggressive algorithm, a robustness regression model, a Huber regression model, or any other suitable model that may occur to persons skilled in the art upon reviewing the entirety of this disclosure. Linear regression models may be generalized in an embodiment to polynomial regression models, whereby a polynomial equation (e.g. a quadratic, cubic or higher-order equation) providing a best predicted output/actual output fit is sought; similar methods to those described above may be applied to minimize error functions, as will be apparent to persons skilled in the art upon reviewing the entirety of this disclosure.

Continuing to refer to FIG. 9, machine-learning algorithms may include, without limitation, linear discriminant analysis. Machine-learning algorithm may include quadratic discriminate analysis. Machine-learning algorithms may include kernel ridge regression. Machine-learning algorithms may include support vector machines, including without limitation support vector classification-based regression processes. Machine-learning algorithms may include stochastic gradient descent algorithms, including classification and regression algorithms based on stochastic gradient descent. Machine-learning algorithms may include nearest neighbors algorithms. Machine-learning algorithms may include various forms of latent space regularization such as variational regularization. Machine-learning algorithms may include Gaussian processes such as Gaussian Process Regression. Machine-learning algorithms may include cross-decomposition algorithms, including partial least squares and/or canonical correlation analysis. Machine-learning algorithms may include naïve Bayes methods. Machine-learning algorithms may include algorithms based on decision trees, such as decision tree classification or regression algorithms. Machine-learning algorithms may include ensemble methods such as bagging meta-estimator, forest of randomized tress, AdaBoost, gradient tree boosting, and/or voting classifier methods. Machine-learning algorithms may include neural net algorithms, including convolutional neural net processes.

It is to be noted that any one or more of the aspects and embodiments described herein may be conveniently implemented using one or more machines (e.g., one or more computing devices that are utilized as a user computing device for an electronic document, one or more server devices, such as a document server, etc.) programmed according to the teachings of the present specification, as will be apparent to those of ordinary skill in the computer art. Appropriate software coding can readily be prepared by skilled programmers based on the teachings of the present disclosure, as will be apparent to those of ordinary skill in the software art. Aspects and implementations discussed above employing software and/or software modules may also include appropriate hardware for assisting in the implementation of the machine executable instructions of the software and/or software module.

Such software may be a computer program product that employs a machine-readable storage medium. A machine-readable storage medium may be any medium that is capable of storing and/or encoding a sequence of instructions for execution by a machine (e.g., a computing device) and that causes the machine to perform any one of the methodologies and/or embodiments described herein. Examples of a machine-readable storage medium include, but are not limited to, a magnetic disk, an optical disc (e.g., CD, CD-R, DVD, DVD-R, etc.), a magneto-optical disk, a read-only memory "ROM" device, a random access memory "RAM" device, a magnetic card, an optical card, a solid-state memory device, an EPROM, an EEPROM, and any combinations thereof. A machine-readable medium, as used herein, is intended to include a single medium as well as a collection of physically separate media, such as, for example, a collection of compact discs or one or more hard disk drives in combination with a computer memory. As used herein, a machine-readable storage medium does not include transitory forms of signal transmission.

Such software may also include information (e.g., data) carried as a data signal on a data carrier, such as a carrier wave. For example, machine-executable information may be included as a data-carrying signal embodied in a data carrier in which the signal encodes a sequence of instruction, or portion thereof, for execution by a machine (e.g., a computing device) and any related information (e.g., data structures and data) that causes the machine to perform any one of the methodologies and/or embodiments described herein.

Examples of a computing device include, but are not limited to, an electronic book reading device, a computer workstation, a terminal computer, a server computer, a handheld device (e.g., a tablet computer, a smartphone, etc.), a web appliance, a network router, a network switch, a network bridge, any machine capable of executing a sequence of instructions that specify an action to be taken by that machine, and any combinations thereof. In one example, a computing device may include and/or be included in a kiosk.

Figure 10:
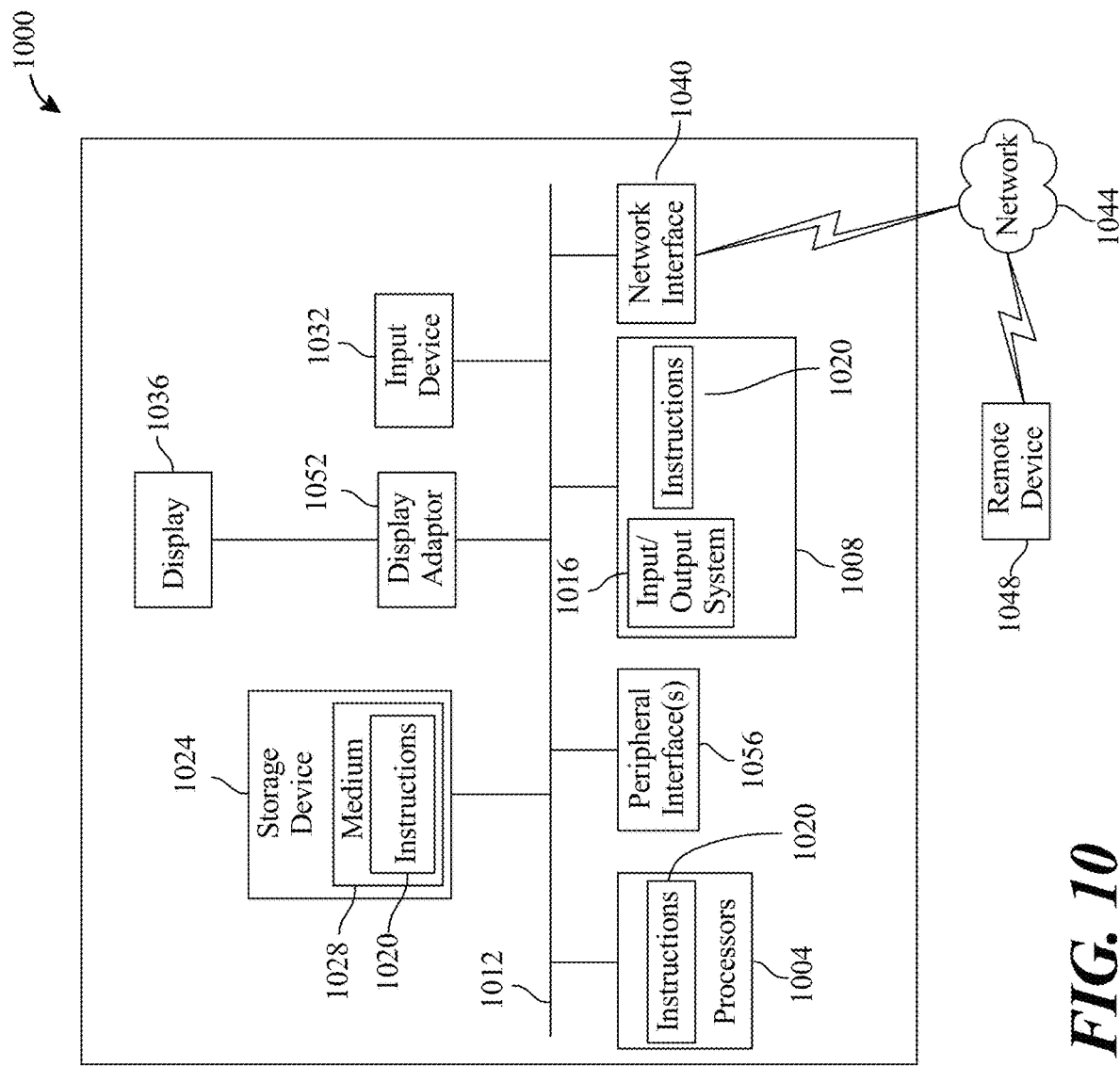
FIG. 10 is a block diagram of a computing system that can be used to implement any one or more of the methodologies disclosed herein and any one or more portions thereof.

FIG. 10 shows a diagrammatic representation of one embodiment of a computing device in the exemplary form of a computer system 1000 within which a set of instructions for causing a control system to perform any one or more of the aspects and/or methodologies of the present disclosure may be executed. It is also contemplated that multiple computing devices may be utilized to implement a specially configured set of instructions for causing one or more of the devices to perform any one or more of the aspects and/or methodologies of the present disclosure. Computer system 1000 includes a processor 1004 and a memory 1008 that communicate with each other, and with other components, via a bus 1012. Bus 1012 may include any of several types of bus structures including, but not limited to, a memory bus, a memory controller, a peripheral bus, a local bus, and any combinations thereof, using any of a variety of bus architectures.

Processor 1004 may include any suitable processor, such as without limitation a processor incorporating logical circuitry for performing arithmetic and logical operations, such as an arithmetic and logic unit (ALU), which may be regulated with a state machine and directed by operational inputs from memory and/or sensors; processor 1004 may be organized according to Von Neumann and/or Harvard architecture as a non-limiting example. Processor 1004 may include, incorporate, and/or be incorporated in, without limitation, a microcontroller, microprocessor, digital signal processor (DSP), Field Programmable Gate Array (FPGA), Complex Programmable Logic Device (CPLD), Graphical Processing Unit (GPU), general purpose GPU, Tensor Processing Unit (TPU), analog or mixed signal processor, Trusted Platform Module (TPM), a floating point unit (FPU), and/or system on a chip (SoC).

Memory 1008 may include various components (e.g., machine-readable media) including, but not limited to, a random-access memory component, a read only component, and any combinations thereof. In one example, a basic input/output system 1016 (BIOS), including basic routines that help to transfer information between elements within computer system 1000, such as during start-up, may be stored in memory 1008. Memory 1008 may also include (e.g., stored on one or more machine-readable media) instructions (e.g., software) 1020 embodying any one or more of the aspects and/or methodologies of the present disclosure. In another example, memory 1008 may further include any number of program modules including, but not limited to, an operating system, one or more application programs, other program modules, program data, and any combinations thereof.

Computer system 1000 may also include a storage device 1024. Examples of a storage device (e.g., storage device 1024) include, but are not limited to, a hard disk drive, a magnetic disk drive, an optical disc drive in combination with an optical medium, a solid-state memory device, and any combinations thereof. Storage device 1024 may be connected to bus 1012 by an appropriate interface (not shown). Example interfaces include, but are not limited to, SCSI, advanced technology attachment (ATA), serial ATA, universal serial bus (USB), IEEE 1394 (FIREWIRE), and any combinations thereof. In one example, storage device 1024 (or one or more components thereof) may be removably interfaced with computer system 1000 (e.g., via an external port connector (not shown)). Particularly, storage device 1024 and an associated machine-readable medium 1028 may provide nonvolatile and/or volatile storage of machine-readable instructions, data structures, program modules, and/or other data for computer system 1000. In one example, software 1020 may reside, completely or partially, within machine-readable medium 1028. In another example, software 1020 may reside, completely or partially, within processor 1004.

Computer system 1000 may also include an input device 1032. In one example, a user of computer system 1000 may enter commands and/or other information into computer system 1000 via input device 1032. Examples of an input device 1032 include, but are not limited to, an alpha-numeric input device (e.g., a keyboard), a pointing device, a joystick, a gamepad, an audio input device (e.g., a microphone, a voice response system, etc.), a cursor control device (e.g., a mouse), a touchpad, an optical scanner, a video capture device (e.g., a still camera, a video camera), a touchscreen, and any combinations thereof. Input device 1032 may be interfaced to bus 1012 via any of a variety of interfaces (not shown) including, but not limited to, a serial interface, a parallel interface, a game port, a USB interface, a FIREWIRE interface, a direct interface to bus 1012, and any combinations thereof. Input device 1032 may include a touch screen interface that may be a part of or separate from display 1036, discussed further below. Input device 1032 may be utilized as a user selection device for selecting one or more graphical representations in a graphical interface as described above.

A user may also input commands and/or other information to computer system 1000 via storage device 1024 (e.g., a removable disk drive, a flash drive, etc.) and/or network interface device 1040. A network interface device, such as network interface device 1040, may be utilized for connecting computer system 1000 to one or more of a variety of networks, such as network 1044, and one or more remote devices 1048 connected thereto. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network, such as network 1044, may employ a wired and/or a wireless mode of communication. In general, any network topology may be used. Information (e.g., data, software 1020, etc.) may be communicated to and/or from computer system 1000 via network interface device 1040.

Computer system 1000 may further include a video display adapter 1052 for communicating a displayable image to a display device, such as display device 1036. Examples of a display device include, but are not limited to, a liquid crystal display (LCD), a cathode ray tube (CRT), a plasma display, a light emitting diode (LED) display, and any combinations thereof. Display adapter 1052 and display device 1036 may be utilized in combination with processor 1004 to provide graphical representations of aspects of the present disclosure. In addition to a display device, computer system 1000 may include one or more other peripheral output devices including, but not limited to, an audio speaker, a printer, and any combinations thereof. Such peripheral output devices may be connected to bus 1012 via a peripheral interface 1056. Examples of a peripheral interface include, but are not limited to, a serial port, a USB connection, a FIREWIRE connection, a parallel connection, and any combinations thereof.

The foregoing has been a detailed description of illustrative embodiments of the invention. Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments, what has been described herein is merely illustrative of the application of the principles of the present invention. Additionally, although particular methods herein may be illustrated and/or described as being performed in a specific order, the ordering is highly variable within ordinary skill to achieve methods, systems, and software according to the present disclosure. Accordingly, this description is meant to be taken only by way of example, and not to otherwise limit the scope of this invention.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A system for predicting a battery lifetime of a battery during use in an electric vehicle, the system comprising:
 a computing device communicatively connected to at least a pack monitor unit, wherein:
 the at least a pack monitor unit is configured to detect a battery pack datum of a plurality of battery modules incorporated in a battery pack;
 the computing device is configured to:
 receive the battery pack datum as a function of the at least a pack monitor unit;
 generate, as a function of the battery pack datum, a digital twin comprising a battery pack model associated with the battery pack of the electric vehicle;
 receive periodic instances of battery pack data;
 periodically update the digital twin as a function of the received battery pack data;
 simulate a virtual representation of the digital twin; and
 predict the battery lifetime of the battery pack as a function of the virtual representation.

2. The system of claim 1, wherein the electric vehicle comprises an electric vertical take-off and landing (eVTOL) aircraft.

3. The system of claim 1, wherein the battery pack datum further comprises a state of charge of the battery pack.

4. The system of claim 1, wherein the battery pack datum further comprises a state of health of the battery pack.

5. The system of claim 1, wherein receiving periodic instances of battery pack data comprises utilizing a timer module configured to provide specific time intervals for the at least a pack monitor unit to capture the battery pack data.

6. The system of claim 1, wherein the battery pack model comprises electrochemical model of a battery.

7. The system of claim 1, wherein the battery lifetime prediction is further generated as a function of a plurality of battery pack models.

8. The system of claim 1, wherein predicting a battery lifetime comprises training a machine-learning model with training data derived from a battery database, wherein the machine-learning model is configured to output the battery lifetime prediction.

9. The system of claim 1, wherein the battery pack model further comprises a plurality of virtual instances of the battery pack data updated continuously.

10. The system of claim 9, wherein the plurality of virtual instances is stored in a battery database communicatively connected to a battery management system integrated into the battery pack.

11. A method for predicting a battery lifetime of a battery during use in an electric vehicle, the method comprising:
    detecting, by at least a pack monitor unit communicatively connected to a computing device, a battery pack datum of a plurality of battery modules incorporated in a battery pack;
    receiving, by the computing device, the battery pack datum from the at least a pack monitor unit;
    generating, as a function of the battery pack datum, a digital twin comprising a battery pack model associated with the battery pack of the electric vehicle;
    receiving, by the computing device, periodic instances of battery pack data;
    periodically updating, by the computing device, the digital twin as a function of the received battery pack data;
    simulating a virtual representation of the digital twin; and
    predicting, by the computing device, the battery lifetime of the battery pack as a function of the virtual representation.

12. The method of claim 11, wherein the electric vehicle comprises an electric vertical take-off and landing (eVTOL) aircraft.

13. The method of claim 11, wherein detecting the battery pack datum further comprises detecting a state of charge of the battery pack.

14. The method of claim 11, wherein detecting the battery pack datum further comprises detecting a state of health of the battery pack.

15. The method of claim 11, wherein receiving periodic instances of battery pack data comprises utilizing a timer module configured to provide specific time intervals for the at least a pack monitor unit to capture the battery pack data.

16. The method of claim 11, wherein the battery pack model comprises electrochemical model of a battery.

17. The method of claim 11, predicting, by the computing device, the battery lifetime is further comprising utilizing a plurality of battery pack models.

18. The method of claim 11, wherein predicting a battery lifetime comprises training a machine-learning with training data derived from a battery database, wherein the machine-learning model is configured to output the battery lifetime prediction.

19. The method of claim 11, wherein the battery pack model further comprises a plurality of virtual instances of the battery pack data updated continuously.

20. The method of claim 19, further comprising storing, by the computing device, the plurality of virtual instances of the battery pack data in a battery database communicatively connected to a battery management system integrated into the battery pack.

* * * * *